United States Patent
Song et al.

(10) Patent No.: US 9,443,881 B2
(45) Date of Patent: Sep. 13, 2016

(54) THIN FILM TRANSISTOR SUBSTRATE AND THE METHOD THEREOF

(71) Applicant: SAMSUNG DISPLAY CO., LTD., Yongin, Gyeonggi-Do (KR)

(72) Inventors: Jean-Ho Song, Yongin-si (KR); Shin-Il Choi, Hwaseong-si (KR); Sun-Young Hong, Yongin-si (KR); Shi-Yul Kim, Yongin-si (KR); Ki-Yeup Lee, Yongin-si (KR); Jae-Hyoung Youn, Seoul (KR); Sung-Ryul Kim, Cheonan-si (KR); O-Sung Seo, Seoul (KR); Yang-Ho Bae, Seoul (KR); Jong-Hyun Choung, Hwaseong-si (KR); Dong-Ju Yang, Seoul (KR); Bong-Kyun Kim, Hwaseong-si (KR); Hwa-Yeul Oh, Asan-si (KR); Pil-Soon Hong, Hwaseong-si (KR); Byeong-Beom Kim, Suwon-si (KR); Je-Hyeong Park, Hwaseong-si (KR); Yu-Gwang Jeong, Yongin-si (KR); Jong-In Kim, Suwon-si (KR); Nam-Seok Suh, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/518,278

(22) Filed: Oct. 20, 2014

(65) Prior Publication Data

US 2015/0053984 A1 Feb. 26, 2015

Related U.S. Application Data

(62) Division of application No. 12/844,356, filed on Jul. 27, 2010, now Pat. No. 8,865,528.

(30) Foreign Application Priority Data

Dec. 4, 2009 (KR) .......................... 10-2009-0119992

(51) Int. Cl.
*H01L 29/04* (2006.01)
*H01L 27/12* (2006.01)
(Continued)

(52) U.S. Cl.
CPC ............. *H01L 27/124* (2013.01); *H01L 27/12* (2013.01); *H01L 27/1214* (2013.01); *H01L 27/1288* (2013.01); *H01L 29/42368* (2013.01); *H01L 29/458* (2013.01); *H01L 29/78669* (2013.01)

(58) Field of Classification Search
CPC . H01L 27/1214; H01L 27/12; H01L 27/124; H01L 27/1288; H01L 29/78669; H01L 29/458; H01L 29/42368
See application file for complete search history.

(56) References Cited

U.S. PATENT DOCUMENTS

| 8,865,528 B2 | 10/2014 | Song et al. |
| 2004/0056251 A1 | 3/2004 | Kim et al. |

(Continued)

FOREIGN PATENT DOCUMENTS

| CN | 1495851 | 5/2004 |
| CN | 1614490 | 5/2005 |

(Continued)

*Primary Examiner* — A. Sefer
(74) *Attorney, Agent, or Firm* — F. Chau & Associates, LLC

(57) ABSTRACT

A thin film transistor array panel includes a gate line, a gate insulating layer that covers the gate line, a semiconductor layer that is disposed on the gate insulating layer, a data line and drain electrode that are disposed on the semiconductor layer, a passivation layer that covers the data line and drain electrode and has a contact hole that exposes a portion of the drain electrode, and a pixel electrode that is electrically connected to the drain electrode through the contact hole. The data line and drain electrode each have a double layer that includes a lower layer of titanium and an upper layer of copper, and the lower layer is wider than the upper layer, and the lower layer has a region that is exposed. The gate insulating layer may have a step shape.

11 Claims, 16 Drawing Sheets

(51) Int. Cl.
*H01L 29/423* (2006.01)
*H01L 29/45* (2006.01)
*H01L 29/786* (2006.01)

(56) References Cited

U.S. PATENT DOCUMENTS

| | | |
|---|---|---|
| 2005/0094079 A1 | 5/2005 | Yoo et al. |
| 2007/0048910 A1 | 3/2007 | Yoon et al. |
| 2007/0210309 A1* | 9/2007 | Cho .................. H01L 27/124 257/59 |
| 2007/0285591 A1* | 12/2007 | Moh ................ G02F 1/136213 349/42 |
| 2008/0138942 A1 | 6/2008 | Lee et al. |
| 2008/0203390 A1 | 8/2008 | Kim et al. |
| 2009/0121234 A1 | 5/2009 | Jeon et al. |
| 2009/0224257 A1 | 9/2009 | Chin et al. |
| 2009/0236600 A1* | 9/2009 | Yamazaki ............ H01L 29/04 257/59 |
| 2010/0117076 A1* | 5/2010 | Akimoto ......... H01L 29/66969 257/43 |
| 2010/0308334 A1* | 12/2010 | Choi et al. ..................... 257/59 |

FOREIGN PATENT DOCUMENTS

| | | |
|---|---|---|
| CN | 1623117 | 6/2005 |
| CN | 1893116 | 1/2007 |
| CN | 101527307 | 9/2009 |
| JP | 02-234133 | 9/1990 |
| JP | 05-041390 | 2/1993 |
| JP | 05-206079 | 8/1993 |
| JP | 2001-059191 | 3/2001 |
| JP | 2002-341373 | 11/2002 |
| JP | 2004-133422 | 4/2004 |
| JP | 2006-108612 | 4/2006 |
| KR | 1020010015041 | 2/2001 |
| KR | 1020050042646 | 5/2005 |
| KR | 1020090049866 | 5/2009 |
| KR | 1020090096226 | 9/2009 |

* cited by examiner

THIN FILM TRANSISTOR SUBSTRATE AND THE METHOD THEREOF

CROSS-REFERENCE TO RELATED APPLICATION

This application is a divisional application of co-pending U.S. application Ser. No. 12/844,356 filed Jul. 27, 2010, which claims priority to Korean Patent Application No. 10-2009-0119992, filed in the Korean Intellectual Property Office on Dec. 4, 2009, the disclosures of which are each hereby incorporated by reference herein in their entireties.

BACKGROUND (a) Technical Field

Embodiments of the present invention relate to a thin film transistor array panel and a manufacturing method thereof.

(b) Discussion of Related Art

A thin film transistor (TFT) array panel may be used for independently driving each pixel in a liquid crystal display or an organic electro luminescence (EL) display device. The thin film transistor array panel may include a gate wire that transfers a scanning signal and a data wire that transfers an image signal. The array panel may include a thin film transistor that is connected to the gate wire and data wire, and a pixel electrode that is connected to a thin film transistor.

The thin film transistor may include a gate electrode, a semiconductor layer that forms a channel, and a source electrode and drain electrode that are formed by portions of the data wire. The thin film transistor is a switching element that transports or interrupts a data voltage that is transmitted through the data wire to a pixel electrode according to the gate signal through the gate wire.

As the size of the array panel increases, so does the occurrences of RC delay due to resistance and capacitance of the wiring therein. The occurrences of RC delay may be reduced by using a wire having a low resistance, such as copper. However, copper may be difficult to etch and contact to other layers. Further, copper may suffer from oxidation and corrosion.

SUMMARY OF THE INVENTION

At least one exemplary embodiment of the invention improves a characteristic of a thin film transistor by forming a low resistant wiring that has a double layer of copper and titanium. The layer that includes the copper and the layer that includes the titanium may be separately etched to form a fine pattern, and to improve stability by lowering resistance of the wiring using copper. A nonperoxide-based etchant may be used when the layer that includes copper and the layer that includes titanium are etched.

A thin film transistor array panel according to an exemplary embodiment of the present invention includes a gate line, a gate insulating layer that covers the gate line, a semiconductor layer that is formed on the gate insulating layer, a data line and drain electrode that are formed on the semiconductor layer, a passivation layer that covers the data line and drain electrode and has a contact hole that exposes a portion of the drain electrode, and a pixel electrode that is electrically connected to the drain electrode through the contact hole. The data line and drain electrode form a double layer that includes a lower layer of titanium and an upper layer of copper, and the lower layer is wider than the upper layer and has a portion that is exposed to the outside.

The width of the exposed region of the lower layer may be about 15 to about 70% of that of the lower layer. The gate insulating layer may have a first portion that has a first thickness and a second portion that has a second thickness that is smaller than the first portion. A difference between the first thickness and the second thickness may be about ⅛ to about ¾ of the first thickness. The gate insulating layer may have a step shape. An interface between the first portion and the second portion of the gate insulating layer may be disposed at a predetermined interval from the semiconductor layer. An interface between the first portion and the second portion of the gate insulating layer may correspond to the interface of the semiconductor layer. The gate line may be formed of a double layer of the lower layer that includes titanium and the upper layer that includes copper. The contact hole may expose the upper layer of the drain electrode to contact the upper layer and the pixel electrode. The thin film transistor may further include a resistant contact layer that is disposed between the semiconductor layer and the data line and drain electrode.

A method for manufacturing a thin film transistor array panel according to an exemplary embodiment of the present invention comprises the steps of forming a gate line that includes a gate electrode on an insulation substrate, forming a gate insulating layer that covers the gate line, continuously layering a first metal layer that includes an amorphous silicon layer and titanium and a second metal layer that includes copper on the gate insulating layer, forming a photosensitive film pattern that has a first portion and a second portion having thickness higher than that of the first portion on the second metal layer, simultaneously etching the second metal layer and the first metal layer by using the photosensitive film pattern as a mask, etching the amorphous silicon layer by using the photosensitive film pattern as the mask, changing the photosensitive film pattern into the second photosensitive film pattern by etchback, forming an upper layer of a data line and drain electrode by wet etching only the second metal layer using the photosensitive film pattern as the mask, forming a lower layer of the data line and drain electrode, the amorphous silicon layer, and the gate insulating layer having different thicknesses by dry etching the first metal layer, the amorphous silicon layer and the gate insulating layer using the photosensitive film pattern as the mask, forming a passivation layer that includes a contact hole for exposing a portion of the drain electrode after the second photosensitive film pattern is removed, and forming a pixel electrode that is connected to the drain electrode through the contact hole on the passivation layer.

The step for simultaneously etching the second metal layer and the first metal layer may be performed by wet etching using a nonperoxide-based etchant that includes a fluorine (F) component. The step for only wet etching the second metal layer may be performed by wet etching using a nonperoxide-based etchant that does not include a fluorine (F) component. The step for dry etching the first metal layer, amorphous silicon layer and gate insulating layer that are not covered by the second photosensitive film pattern and disposed outside the gate electrode may be performed until the amorphous silicon layer is completely removed. The step for forming the gate line may form the gate line as a double layer that includes a lower layer of titanium and an upper layer of copper, and may perform wet etching by using the nonperoxide-based etchant that includes the fluorine (F) component.

The amorphous silicon layer may be formed of a first amorphous silicon layer that does not include impurities and a second amorphous silicon layer that is doped with conductive impurity and disposed on the first amorphous silicon layer, a semiconductor that includes a channel portion of the thin film transistor may be formed by etching the first amorphous silicon layer, and an ohmic contact layer may be formed by etching the second amorphous silicon layer.

The step for forming a lower layer of the data line and drain electrode, the amorphous layer, and the gate insulating layer having different thicknesses by dry etching the first metal layer, the amorphous silicon layer and the gate insulating layer using the second photosensitive film pattern as the mask may further include removing a titanium oxide layer that is not covered with the second metal layer and disposed on the first metal layer surface.

The step for forming a lower layer of the data line and drain electrode, the amorphous layer, and the gate insulating layer having different thicknesses by dry etching the first metal layer, the amorphous silicon layer and the gate insulating layer using the second photosensitive film pattern as the mask may further include a first step of removing the titanium oxide layer, a second step of etching the first metal layer and the amorphous silicon layer and a third step of performing a post treatment.

The first step of removing the titanium oxide layer may use a first method for removing a titanium oxide layer 170s by using a gas that includes F such as $SF_6$, and $CF_4$, or a second method by using various gases that include $SF_6$ (e.g., $SF_6$ only, $SF_6$/He, $SF_6$/$N_2$, $SF_6$/$O_2$, $SF_6$/$O_2$/He). When the titanium oxide layer is removed by the second method, the weight ratio of $SF_6$ and helium (He) may be 1:0 to 1:5, and the pressure range used in etching may be 60 to 400 mT.

The step for forming a lower layer of the data line and drain electrode, the amorphous layer, and the gate insulating layer having different thicknesses by dry etching the first metal layer, the amorphous silicon layer and the gate insulating layer using the second photosensitive film pattern as the mask may further include a first step of removing the titanium oxide layer, a second step of removing the first metal layer, a third step of etching the amorphous silicon layer and a fourth step of performing post treatment. At the second step, a gas that includes Cl among $Cl_2$/He, $Cl_2$/Ar, and $Cl_2$ may only be used, the weight ratio of $Cl_2$ and helium (He) may be 1:0 to 1:5, and the pressure range used in etching may be 60 to 200 mT.

A method for manufacturing a thin film transistor array panel according to an exemplary embodiment of the present invention comprises the steps of forming a gate line that includes a gate electrode on an insulation substrate; forming a gate insulating layer that covers the gate line, continuously layering a first metal layer that includes an amorphous silicon layer and titanium and a second metal layer that includes copper on the gate insulating layer, forming a photosensitive film pattern that has a first portion and a second portion having thickness higher than that of the first portion on the second metal layer, simultaneously etching the second metal layer and the first metal layer by using the photosensitive film pattern as a mask, changing the photosensitive film pattern into a second photosensitive film pattern by etchback, etching the amorphous silicon layer by using the second photosensitive film pattern as the mask, forming an upper layer of a data line and drain electrode by wet etching only the second metal layer using the photosensitive film pattern as the mask, forming a lower layer of the data line and drain electrode, the amorphous layer, and the gate insulating layer having the different thickness by dry etching the first metal layer, the amorphous silicon layer and the gate insulating layer using the photosensitive film pattern as the mask, forming a passivation layer that includes a contact hole for exposing a portion of the drain electrode after the second photosensitive film pattern is removed, and forming a pixel electrode that is connected to the drain electrode through the contact hole on the passivation layer.

The step of simultaneously etching the second metal layer and the first metal layer may perform wet etching by using a nonperoxide-based etchant that includes a fluorine (F) component. The step of only wet etching the second metal layer may perform wet etching by using a nonperoxide-based etchant that does not include a fluorine (F) component. The step of forming the gate line may form the gate line as a double layer that includes a lower layer of titanium and an upper layer of copper, and may perform wet etching by using the nonperoxide-based etchant that includes the fluorine (F) component.

The amorphous silicon layer may be formed of a first amorphous silicon layer that does not include impurities and the second amorphous silicon layer that is doped with a conductive impurity and disposed on the first amorphous silicon layer, a semiconductor that includes a channel portion of the thin film transistor may be formed by etching the first amorphous silicon layer, and an ohmic contact layer may be formed by etching the second amorphous silicon layer.

The step for forming a lower layer of the data line and the drain electrode, the amorphous layer, and the gate insulating layer having different thicknesses may be performed by dry etching the first metal layer, the amorphous silicon layer and gate insulating layer using the second photosensitive film pattern as the mask may further include removing a titanium oxide layer that is not covered with the second metal layer and disposed on the first metal layer surface.

The step for forming a lower layer of the data line and the drain electrode, the amorphous layer, and the gate insulating layer having different thicknesses by dry etching the first metal layer, the amorphous silicon layer and the gate insulating layer using the second photosensitive film pattern as the mask may further include a first step of removing the titanium oxide layer, a second step of etching the first metal layer and the amorphous silicon layer and a third step of performing a post treatment.

The first step of removing the titanium oxide layer may use a first method for removing a titanium oxide layer by using a gas that includes F such as $SF_6$, and $CF_4$, or a second method by using various gases that include $SF_6$ (e.g., SF6 only, $SF_6$/He, $SF_6$/N2, $SF_6$/$O_2$, $SF_6$/$O_2$/He). When the titanium oxide layer is removed by the second method, the weight ratio of $SF_6$ and helium (He) may be 1:0 to 1:5, and the pressure range used in etching may be 60 to 400 mT.

The step for forming a lower layer of the data line and drain electrode, a semiconductor layer, and a gate insulating layer having different thicknesses by dry etching the first metal layer, amorphous silicon layer and gate insulating layer using the second photosensitive film pattern as the mask may further include a first step of removing the titanium oxide layer, a second step of removing the first metal layer, a third step of etching the amorphous silicon layer, and a fourth step of performing post treatment. At the second step, a gas that includes Cl among $Cl_2$/He, $Cl_2$/Ar, and $Cl_2$ may only be used, the weight ratio of $Cl_2$ and helium (He) may be 1:0 to 1:5, and the pressure range used in etching may be 60 to 200 mT.

An exemplary embodiment of the invention includes a method for manufacturing a thin film transistor array panel. The method includes forming a gate line that includes a gate electrode on an insulation substrate, forming a gate insulating layer that covers the gate line, forming a semiconductor layer on the gate insulating layer, forming a first metal layer that includes titanium and a second metal layer that includes copper on the semiconductor layer such that the first metal layer is above the second metal layer, and forming a data line and a drain electrode by removing part of the first and second metal layers such that the second metal layer is wider than the first metal later, and the second metal layer has a region that is exposed.

An exemplary embodiment of the invention includes a method for manufacturing a thin film transistor array panel. The method includes forming a semiconductor layer on a gate insulating layer, forming a first metal layer that includes titanium and a second metal layer that includes copper on the semiconductor layer such that the first metal layer is above the second metal layer, forming a photosensitive film pattern that has a first portion and a second portion having a thickness higher than that of the first portion on the second metal layer, simultaneously etching the second metal layer and the first metal layer by using the photosensitive film pattern as a mask, performing one of (i) etching the semiconductor layer by using the photosensitive film pattern as the mask and changing the photosensitive film pattern into a second photosensitive film pattern by etchback or (2) changing the photosensitive film pattern into a second photosensitive film pattern by etchback and etching the semiconductor layer by using the second photosensitive film pattern as the mask, forming an upper layer of a data line and drain electrode by wet etching only the second metal layer using the second photosensitive film pattern as the mask, and forming a lower layer of the data line and the drain electrode, the semiconductor layer, and the gate insulating layer to have different thicknesses by dry etching the first metal layer, the semiconductor layer and the gate insulating layer using the second photosensitive film pattern as the mask.

DETAILED DESCRIPTION OF EXEMPLARY EMBODIMENTS

Figure 1:
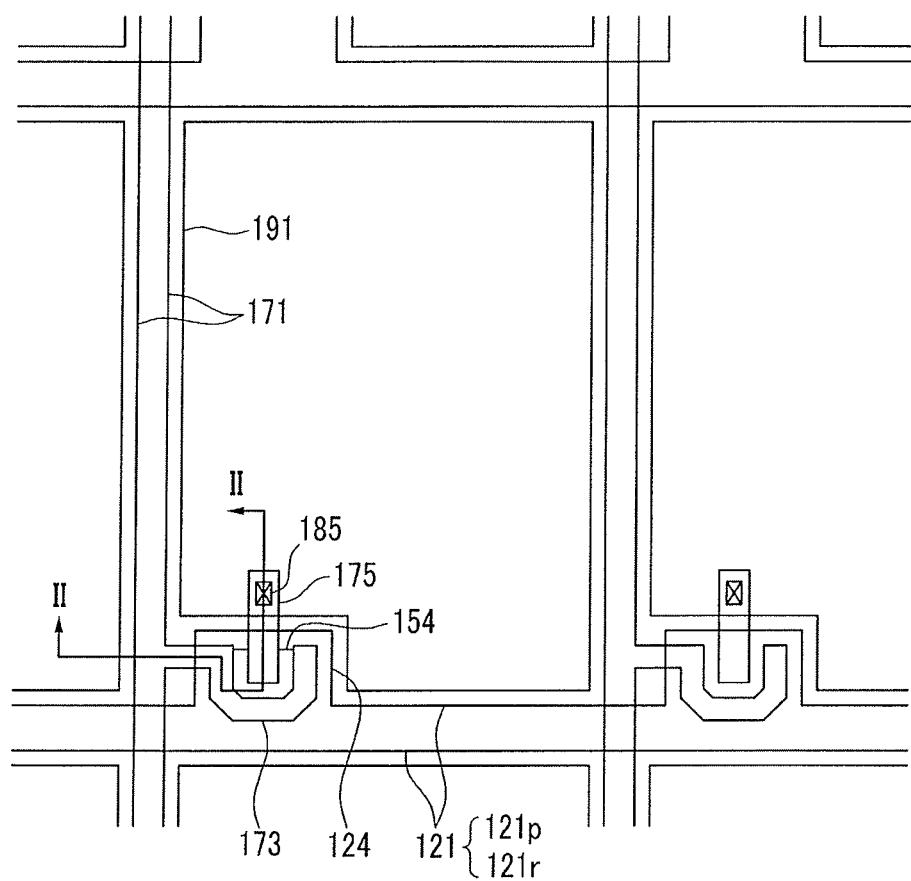
FIG. 1 is a layout view that illustrates a pixel of a thin film transistor array panel according to an exemplary embodiment of the present invention.

The present invention will be described more fully hereinafter with reference to the accompanying drawings, in which exemplary embodiments of the invention are shown.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

Hereinafter, a thin film transistor array panel according to an exemplary embodiment of the present invention will be described in detail with reference to FIG. 1 and FIG. 2. FIG. 1 is a layout view that illustrates a thin film transistor array panel according to an exemplary embodiment of the present invention, and FIG. 2 is a cross-sectional view that is taken along the line II-II of FIG. 1.

Figure 2:
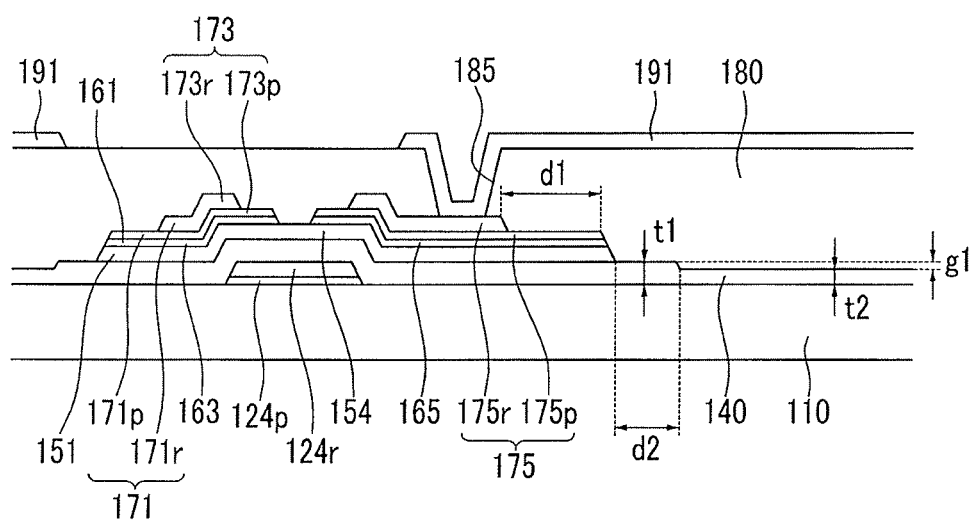
FIG. 2 is a cross-sectional view that is taken along the line II-II of FIG. 1, FIG. 3 to FIG. 12 are cross-sectional views that illustrate a manufacturing method of the thin film transistor array panel according to an exemplary embodiment of the present invention, and the cross-sectional views that are taken along the line II-II of FIG. 1.

Referring to FIG. 1 and FIG. 2, a plurality of gate lines 121 are formed on an insulation substrate 110. The insulation substrate 110 may be formed of a transparent glass or plastic. The gate line 121 transmits a gate signal and extends or mainly extends in a horizontal direction. Each gate line 121 includes a plurality of gate electrodes 124 that protrude from the gate line 121. The gate line 121 and gate electrode 124 have a dual-layer structure. For example, the gate line 121 includes a lower layer 121p and an upper layer 121r and the gate electrode 124 includes a lower layer 124p and an upper layer 124r.

The lower layers 121p and 121p include titanium (Ti) or titanium alloy, and the upper layers 121r and 124r include copper (Cu) or copper alloy. The lower layers 121p and 124p may have a thickness range of about 10 to about 500 Å, and the upper layers 121r and 124r may have a thickness range of about 1000 to about 7000 Å. The lower layer 121p and upper layer 121r of the gate line 121 may each have a tapered side, and be inclined at an angle of more than about 0° and about 70° or less with respect to the substrate 110.

The gate line 121 and gate electrode 124 may be formed of a single layer or multiple layers such as triple layers or more, and may be formed of a material that includes other metals including no copper and titanium (for example, molybdenum, aluminum, chromium, gold, silver, tantalum (Ta) and the like). A gate insulating layer 140 is formed on the gate line 121. The gate insulating layer may be made of an insulating material such as silicon nitride. The gate insulating layer 140 has a first thickness t1 in a first region and a second thickness t2 in a second region, where the first thickness t1 is larger than the second thickness t2. The first region protrudes by a predetermined width d2 (see FIG. 2).

According to an exemplary embodiment of the invention, since the first region is not etched, it may have the first thickness t1. The first thickness t1 may have a value of about 3500 to about 5000 Å, the second thickness t2 may have a value of about 500 to about 4500 Å, and the second thickness t2 may have a value that is about ¼ to about ⅞ of the value of the first thickness t1. A thickness difference g1, which is a difference between the first thickness t1 and the second thickness t2, may have a value of about 500 to about 3000 Å, and a value that is about ⅛ to about ¾ the value of the first thickness t1.

In addition, the width d2 of the region that is exposed from a semiconductor 151 to the outside may be about 0.3 to about 1.5 μm, and in the gate insulating layer 140 that has the first thickness t1, the region that is exposed from the semiconductor 151 may correspond to about 3 to about 30% of the whole region. The width d2 of the region that is exposed from the semiconductor 151 to the outside may vary according to the exemplary embodiment and according to the thickness of each layer.

A semiconductor 151 is formed on the gate insulating layer 140. The semiconductor 151 may be made of hydrogenated amorphous silicon, polysilicon, etc. The semiconductor 151 extends or mainly extends in a vertical direction, and includes a plurality of channel parts 154 that extend toward the gate electrode 124. A plurality of ohmic contact stripes 161 and ohmic contact islands 165 are formed on the semiconductor 151.

The ohmic contact stripe 161 has a plurality of protruding parts 163 that extend toward the channel part 154 of the semiconductor 151, and the protruding part 163 and the ohmic contact island 165 form a pair disposed on the channel part 154 of the semiconductor stripe 151. On the ohmic contact layers 161 and 165 and gate insulating layer 140, a plurality of data lines 171 and a plurality of drain electrodes 175 are formed.

The data line 171 transmits a data signal and extends or mainly extends in a vertical direction while crossing the gate line 121. Each data line 171 extends toward the gate electrode 124 and includes a plurality of source electrodes 173. The drain electrode 175 is separated from the data line 171, and extends toward a part of the source electrode 173. For example, when the source electrode 173 is U-shaped, the drain electrode 175 may extend towards an upper part in the middle of the U-shaped source electrode 173. The data line 171 and drain electrode 175 that include the source electrode 173 have the dual-layer structure of the upper layers 171r, 173r, and 175r and lower layers 171p, 173p, and 175p. The upper layers 171r, 173r, and 175r include copper (Cu) or a copper alloy, and the lower layers 171p, 173p, and 175p include copper (Cu) or a copper alloy. Since the width of the upper layers 171r, 173r, and 175r is narrower than the width of the lower layers 171p, 173p, and 175p, the upper parts of the lower layers 171p, 173p, and 175p are exposed.

Figure 14:
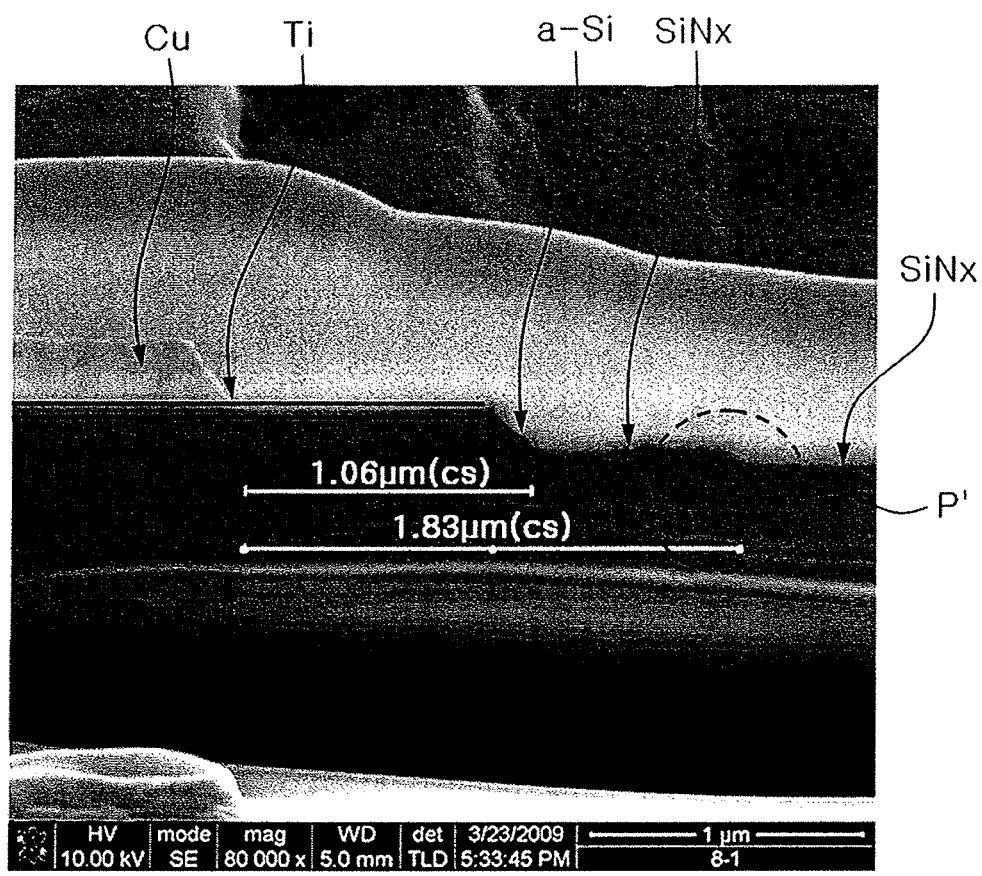
FIG. 14 is a picture that illustrates a cross-section of the thin film transistor in a thin film transistor array panel according to an exemplary embodiment of the present invention.

Referring to FIG. 14, in at least one embodiment, the exposed width of the lower layers 171p, 173p, and 175p may be about 1.06 μm. However, the exposed width is not limited thereto and may vary in alternate embodiments. Referring to FIG. 2, the width d1 of the exposed side of the lower layer 175p may have a range of about 0.3 to about 2.0 μm. For example, about 15 to about 70% of the lower layers 171p, 173p, and 175p may be not be covered with the upper layers 171r, 173r, and 175r, and may instead be exposed. The lower layers 171p, 173p, and 175p may have a thickness of about 10 to about 500 Å, and the upper layers 171r, 173r, and 175r may have a thickness of about 1000 to about 7000 Å. The lower layers 171p, 173p, and 175p and upper layers 171r, 173r, and 175r may each have a tapered side, and may be inclined at an angle of about 30° to about 80° with respect to the substrate 110. To prevent breakage while the data line 171 crosses the gate line 121, the tapered angle of the data line 171 may be larger than the tapered angle of the gate line 121.

The ohmic contact layers 161, 163, and 165 may be present only between the semiconductor 151 therebeneath and the lower layers 171p, 173p, and 175p thereabove. Accordingly, the ohmic contact layers 161, 163, and 165 may lower contact resistance between the semiconductor 151 and the lower layers 171p, 173p, and 175p. The ohmic contact layers 161, 163, and 165 may have substantially the same plane pattern as the lower layers 171p, 173p, and 175p. For example, the ohmic contact layers 161, 163, and 165 and the lower layers 171p, 173p, and 175p may be simultaneously etched by using the same mask.

The channel 154 of the semiconductor 151 includes a portion that is not covered by the data line 171 and the drain electrode 175 as well as a portion disposed between the source electrode 173 and the drain electrode 175. The semiconductor 151 may have substantially the same plane pattern as the ohmic contact layers 161 and 165 except for the exposed portion of the channel part 154. For example, the semiconductor 151 and ohmic contact layers 161, 163, and 165 may be simultaneously etched by using the same mask.

In at least one embodiment of the present invention, the semiconductor 151, ohmic contact layers 161, 163, and 165, data line 171, source electrode 173, and drain electrode 175 are etched by using one mask. As a result thereof, the semiconductor 151, ohmic contact layers 161, 163, and 165, and the lower layers 171p, 173p, and 175p of the data line 171, source electrode 173 and drain electrode 175 have substantially the same plane pattern as the ohmic contact layers 161 and 165 except for the exposed portion of the channel part 154.

One gate electrode 124, one source electrode 173 and one drain electrode 175 form one thin film transistor (TFT) in conjunction with the channel part 154 of the semiconductor 151, and the channel of the thin film transistor is formed at the channel part 154 between the source electrode 173 and drain electrode 175.

A passivation layer is formed on the data line 171, drain electrode 175 and channel part 154 portion. The passivation layer 180 may be made of inorganic insulators such as silicon nitride or silicon oxide, an organic insulator, a low dielectric insulator, etc. The passivation layer 180 comprises a plurality of contact holes 185 that exposes an end of the drain electrode 175.

A plurality of pixel electrodes 191 is disposed on the passivation layer 180. The pixel electrode 191 is physically and electrically connected to the drain electrode 175 through the contact hole 185, and applied with a data voltage from the drain electrode 175. The pixel electrode 191 to which the data voltage is applied forms an electric field in conjunction with a common electrode (not shown) that is applied with a common voltage. The common electrode may be formed in a facing display panel or a thin film transistor array panel, such that the direction of liquid crystal molecules of a liquid crystal layer (not shown) between the common electrode and the pixel electrode 191 is determined.

The pixel electrode 191 and common electrode forms a capacitor (hereinafter, referred to as a liquid crystal capacitor) to maintain the applied voltage after the thin film transistor is turned off. The pixel electrode 191 may form a storage capacitor by overlapping with a storage electrode line (not shown). The voltage maintaining ability of the liquid crystal capacitor may be increased by the storage electrode line. The pixel electrode 191 may be made of a transparent conductor such as indium tin oxide (ITO) or indium zinc oxide (IZO).

The thin film transistor array panel that is shown in FIG. 1 and FIG. 2 will be described in detail with respect to a method for manufacturing the same according to an exemplary embodiment of the present invention with reference to FIG. 2 and FIG. 3 to FIG. 12. FIG. 3 to FIG. 12 are cross-sectional views that illustrate a manufacturing method of the thin film transistor array panel according to an exemplary embodiment of the present invention, and the cross-sectional views that are taken along the line II-II of FIG. 1.

Figure 3:
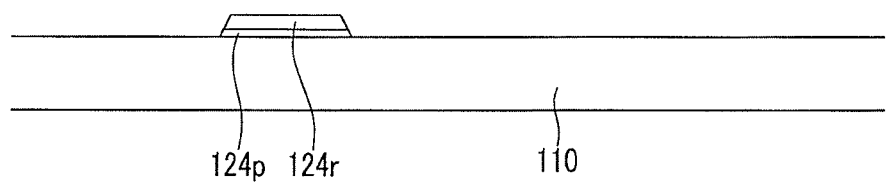

Referring to FIG. 3, titanium (Ti) or a titanium (Ti) alloy is layered on the insulation substrate 110 (e.g., made of transparent glass or plastic), copper (Cu) or copper (Cu) alloy is layered thereon to form a double layer, and the patterning is performed to form the gate line 121 that has the gate electrode 124. The lower layers 121p and 124p that are formed of titanium (Ti) or titanium (Ti) alloy may be layered to have a thickness of about 10 to about 500 Å, and the upper layers 121r and 124r that are formed of copper (Cu) or copper (Cu) alloy may be layered to have a thickness of about 1000 to about 7000 Å. Thereafter, a photosensitive film (not shown) is layered and patterned, and the lower layers 121p and 124p and upper layers 121r and 124r are etched with an etchant by using the patterned photosensitive film (not shown) as a mask. The used etchant may be an etchant that is capable of simultaneously etching the lower layers 121p and 124p and upper layers 121r and 124r. For example, a nonperoxide-based (excluding $H_2O_2$) etchant may be used, which reduces the risk if an explosion to help ensure that the processing of manufacturing is stable. Examples thereof include a first etchant and a second etchant. In the first etchant and the second etchant, the fluorine (F) component is included to enable simultaneous etching of copper (Cu) and titanium (Ti). The following first etchant and second etchant may be used to etch wiring of the above described double layers (e.g., a double layer of pure titanium and pure copper).

The first etchant includes about 0.1 to about 50 weight percent (wt %) of persulfate, about 0.01 to about 2 wt % of azole to a base compound, about 0.01 to about 10 wt % of oxidation supplement agent, about 0 to about 10 wt % of a first oxidation controlling agent, about 0 to about 10 wt % of a second oxidation controlling agent, about 0 to about 10 wt % of a third oxidation controlling agent, about 0 to about 10 wt % of a fourth oxidation controlling agent, about 0.001 to about 10 wt % of a sulfonic acid-based stabilizing agent, about 0.0001 to about 5 wt % of a chelating agent, about 0.1 to about 10 wt % of an inorganic acid. Persulfate may be a main component of the oxidizing agent for etching the copper layer, and may have the purity of semiconductor processes. Examples of the persulfate include ammonium persulfate, potassium persulfate, sodium persulfate, oxone, etc. The persulfate may be used alone or in a mixture.

The oxidation supplement agent enables an etching rate of copper to be relatively quick, while being used as an oxidation supplement agent that is capable of etching the lower layers of titanium or titanium alloy. Examples of the oxidation supplement agent include fluoride-based compound inorganic acids including fluorine such as hydrofluoric acid (HF), ammonium fluoride ($NH_4F$), ammonium bifluoride ($NH_4HF_2$), potassium fluoride (KF), sodium fluoride (NaF), potassium hydrofluoride (CaHF), sodium hydrofluoride ($NaHF_2$), ammonium ($NH_4F$), hydrofluoride ($NH_4HF_2$), ammonium boronfluoride ($NH_4BF_4$), potassium fluoride (KF), potassium hydrofluoride $KHF_2$, aluminum fluoride $AlF_3$, hydroboronic fluoride $HBF_4$, lithium fluoride (LiF), potassium boronfluoride $KBF_4$, potassium fluoride $CaF_2$, and silicate fluoride. However, embodiments of the present invention are not limited thereto. The oxidation supplement agent may be used alone or in a mixture.

The azole-based compound suppresses the etching of the copper layer to reduce a CD Loss. Examples of the azole-based compound include benzotriazole, aminoterazole, imidazole, pyrazole, etc. The azole-based compound may be used alone or in a mixture.

The oxidation controlling agents play a role of controlling oxidation and etching of the copper layer. The first oxidation controlling agent is a compound that may include a nitrate negative ion, and an inorganic acid such as $HNO_3$ and an inorganic salt such as $Fe(NO_3)_3$, $KNO_3$, $NH_4NO_3$, or $LiNO_3$, but it is not limited thereto. The second oxidation controlling agent is a compound that may include a sulfate negative ion ($SO_4^{-2}$) and an inorganic acid such as sulfuric acid ($H_2SO_4$) and an inorganic salt such as $NH_4HSO_4$, $KHSO_4$, or $K_2SO_4$, but it is not limited thereto. The third oxidation controlling agent is a compound that may include a phosphate negative ion, and an inorganic acid such as phosphoric acid ($H_3PO_4$) and an inorganic salt such as $(NH_4)_3PO_4$, $(NH_4)_2HPO_4$, $NH_4H_2PO_4$, $K_3PO_4$, $K_2HPO_4$, $KH_2PO_4$, $Na_3PO_4$, $NaHPO_4$, and $NaH_2PO_4$, but it is not limited thereto. The fourth oxidation controlling agent is a compound that may include an acetate negative ion, and an organic acid such as $CH_3COOH$ and an inorganic salt such as $NH_4CH_3COO$, $KCH_3COO$, $NaCH_3COO$, and $HN(CH_2COOH)_2$, but it is not limited thereto. In addition, the first, second, third, and fourth oxidation controlling agents may be used alone and in a mixture to implement the desired etching characteristic.

The sulfonic acid-based stabilizing agent may suppress the decomposition of persulfate, which may be a main component for etching the copper layer, thus ensuring stability of the etchant. Examples of the sulfonic acid-based stabilizing agent include benzenesulfonic acid (BSA), p-toluenesulfonic acid (p-TSA), methanesulfonic acid (MSA), amidosulnic acid (ASA), etc., but it is not limited thereto. The sulfonic acid-base stabilizing agent may be used alone or in a mixture.

Examples of the inorganic acid include nitric acid, phosphoric acid, sulfuric acid, hydrochloric acid, etc. However, the inorganic acid is not limited thereto. The inorganic acid may be used alone or in a mixture.

The etchant composition may further include a boron-containing compound in an amount of about 0.01 to about 5 wt %. Examples of the boron-containing compound include borate ($R_1BO_3$, $R_2HBO_3$, $R_3H_2BO_3$), methaborate ($R_3BO_2$), tetraborate ($R_2B_4O_7$, $R_3HB_4O_7$), ammonium boronfluoride ($NH_4BF_4$), boronic fluoride $HBF_4$, lithium boronfluoride ($LiBF_4$), sodium boronfluoride ($NaBF_4$), potassium boronfluoride $KBF_4$, etc. However, the boron-containing compound is not limited thereto. The boron-containing compound may be used alone or in a mixture. The symbol $R_1$ may represent $H_3$, $Li_3$, $Na_3$, $NH_{43}$ or $K_3$, the symbol $R_2$ may represent $Li_2$, $Na_2$, $K_2$ or $NH_{42}$, and the symbol $R_3$ may represent Li, Na, K or $NH_4$.

After the copper layer is etched, as long as it does not affect an etching rate of the copper layer using a copper ion, the chelating agent may include one of phosphonic series, sulfonic series, and acetate series chelating agents, but it is not limited thereto.

The second etchant includes about 0.1 to about 30 wt % of ammonium persulfate (($NH_4)_2S_2O_8$), about 0.1 to about 30 wt % of organic acid, about 0.01 to about 5 wt % of fluorine (F) containing compound, about 0.01 to about 5 wt % of ammonium salt compound, about 0.01 to about 10 wt % of glycol-based compound, about 0.01 to about 2 wt % of azole-based compound and water as a remaining part. In the range of the etchant or etchant composition as described above, the etchant that is included in the range of the weight ratio as described above is included, and even though the composition is out of the weight ratio range or there are substitutions of some of the above-mentioned components. For example, if the modified constitution is substantially the same as the etchant composition described above as apparent to those who are skilled in the art, this constitution is included therein.

The tapered side having the angle of more than about 0° and about 70° or less may be formed by simultaneously etching the lower layers 121p and 124p and upper layers 121r and 124r using the nonperoxide-based etchant. The upper layers 121r and 124r and lower layers 121p and 124p may be simultaneously etched by using the same etchant, and the tapered angle may be dependent on the etching rate of the etchant.

The above description provides an example of when the gate line 121 and gate electrode 124 are formed to have a double layer of titanium and copper. However, as described above, the gate line 121 and gate electrode 124 may be formed of metal except for titanium and copper, and thus may be formed to be a single layer or multiple layers such as triple layers or more.

Figure 4:
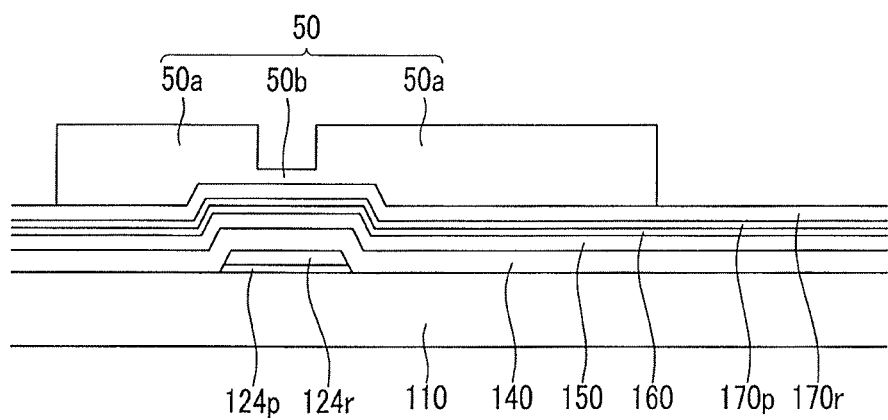

Next, as shown in FIG. 4, on the gate line 121 and gate electrode 124, the gate insulating layer 140, a first amorphous silicon layer 150, a second amorphous silicon layer 160, a first metal layer 170p and a second metal layer 170r are layered thereon. The first amorphous silicon layer 150 does not include an impurity, but the second amorphous silicon layer 160 is doped with a conductive impurity. The first metal layer 170p may be formed of titanium or titanium alloy, and the second metal layer 170r may be formed of copper or copper alloy. The gate insulating layer 140 may be formed to have a thickness of about 3500 to about 5000 Å, the first metal layer 170p may be layered to have a thickness of about 10 to about 500 Å, and the second metal layer 170r may be layered to have a thickness of about 1000 to about 7000 Å.

After a photosensitive layer is formed thereon, it is patterned to form the photosensitive layer pattern 50. The photosensitive layer pattern 50 has first portions 50a and a second portion 50b, where the second portion 50b is thinner than the first portions 50a (e.g., substantially thinner). Various differences in thickness of the photosensitive layer pattern 50 may be obtained by controlling the intensity of light irradiated using the mask or by using a reflow method. When the intensity of light is controlled, a slit pattern or lattice pattern or a semi-transparent layer may be formed on the mask. The second portion 50b having the smaller thickness is formed to correspond to a position at which the channel region of the thin film transistor will be formed.

Figure 5:
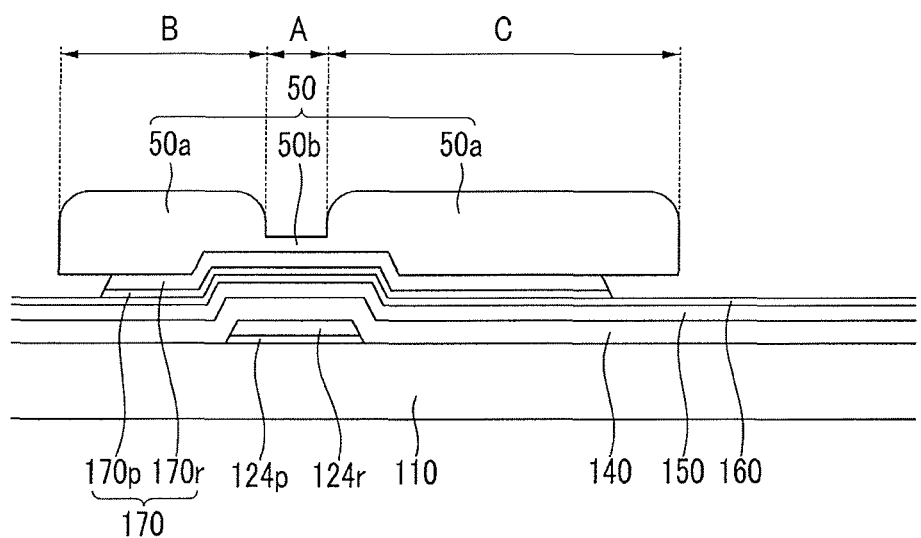

Thereafter, as shown in FIG. 5, the first metal layer 170p and the second metal layer 170r are etched by using the etchant that is capable of simultaneously etching the first metal layer 170p and the second metal layer 170r by using the photosensitive layer pattern 50 as the mask. The etchant that is used herein may be the first etchant and the second etchant that etches the double layer wiring that is formed of pure titanium and pure copper (refer to the description of etching the lower layers 121p and 124p and upper layers 121r and 124r of the gate line 121). As described above, the first etchant or the second etchant includes a fluorine (F) component as the nonperoxide-based etchant. In addition, the first etchant and the second etchant may be used to etch the wiring of the double layer formed of pure titanium and pure copper, and in the example of the alloy, they may not be etched according to the added material. According to at least one exemplary embodiment, the etchant that is used to etch the gate line 121 may be the same as the etchant that is used to etch the first metal layer 170p and the second metal layer 170r.

As shown in FIG. 5, if the first metal layer 170p and the second metal layer 170r are etched by using the etchant, the first metal layer 170p and the second metal layer 170r and a portion of the lower part of the photosensitive layer pattern 50 that are not covered with the photosensitive layer pattern 50 are etched by an isotropic etching characteristic of the etchant.

Figure 6:
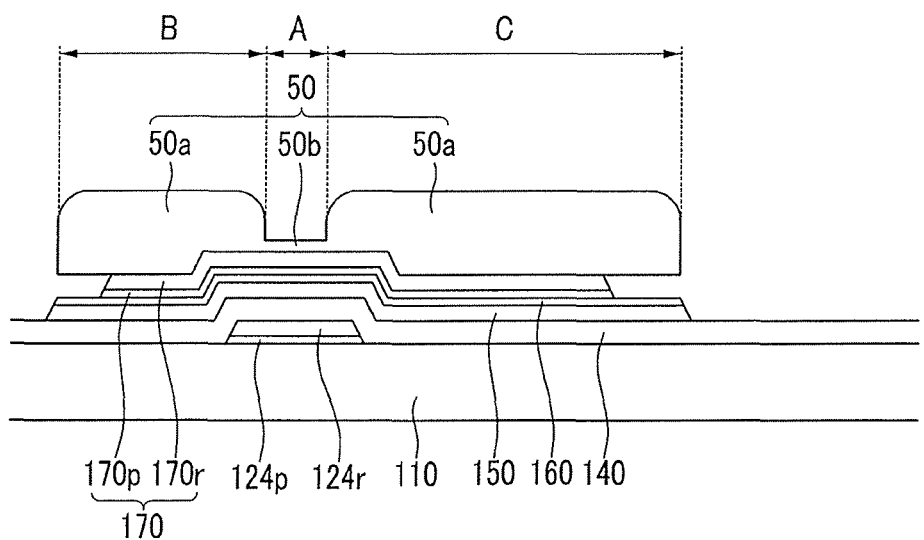

The etchant that etches the first metal layer 170p and the second metal layer 170r does not etch the gate insulating layer 140, the first amorphous silicon layer 150 and the second amorphous silicon layer 160. Thereafter, as shown in FIG. 6, the first amorphous silicon layer 150 and the second amorphous silicon layer 160 are etched by using the photosensitive layer pattern 50 as the mask.

Figure 7:
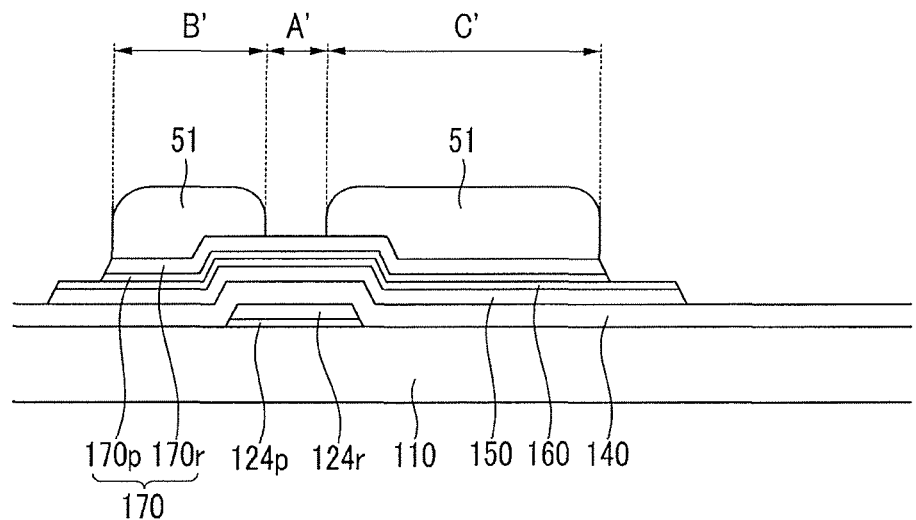

Thereafter, as shown in FIG. 7, the second portion 50b having the smaller thickness is removed by etch back. The first portions 50a are etched to lower their widths and heights, to form the second photosensitive layer pattern 51. The second photosensitive layer pattern 51 is formed in regions B' and C' that are narrower than the regions B and C in which the photosensitive layer pattern 50 is formed in FIG. 5 and FIG. 6. The second photosensitive layer pattern 51 covers the first metal layer 170r region except for the A' region.

Figure 8:
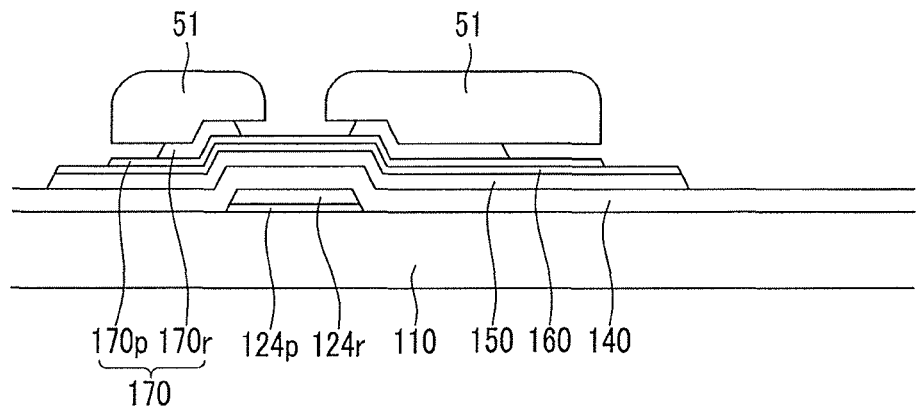

Thereafter, as shown in FIG. 8, only the second metal layer 170r is etched with the etchant by using the second photosensitive layer pattern 51 as the mask. The etchant that is used herein should be different from the etchant that is used in FIG. 3 and FIG. 5. For example, in FIG. 3 and FIG. 5, the etchant can etch both copper and titanium, but in FIG. 8, the etchant that can etch only copper is used. The etchant that is used in FIG. 8 is the nonperoxide-based etchant, and unlike the etchant of FIG. 3 and FIG. 5, it does not include the fluorine (F) component, and examples thereof include the following etchants.

The etchant that etches only the second metal layer 170r including copper includes about 0.1 to about 30 wt % of ammonium persulfate ($NH_{42}S_2O_8$), about 0.1 to about 30 wt % of organic acid, about 0.01 to about 5 wt % of a phosphoric acid salt compound, about 0.01 to about 2 wt % of an azole-based compound and water as the remaining part. In the range of the etchant or etchant composition as described above, the etchant that is included in the range of the weight ratio as described above is also included, and even though the composition is out of the weight ratio range or there are substitutions of some of the above-mentioned components, if the modified constitution is substantially the same as the etchant composition and is apparent to those who are skilled in the art, this constitution is included therein. Through the process of FIG. 8, the upper side of the first metal layer 170p is exposed. The width of the exposed portion of the first metal layer 170p may vary according to exemplary embodiments.

Figure 9:
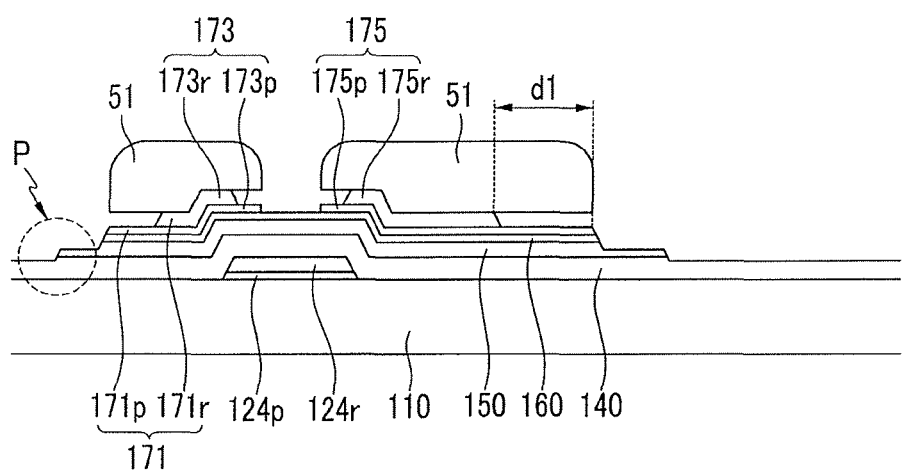
Figure 10:
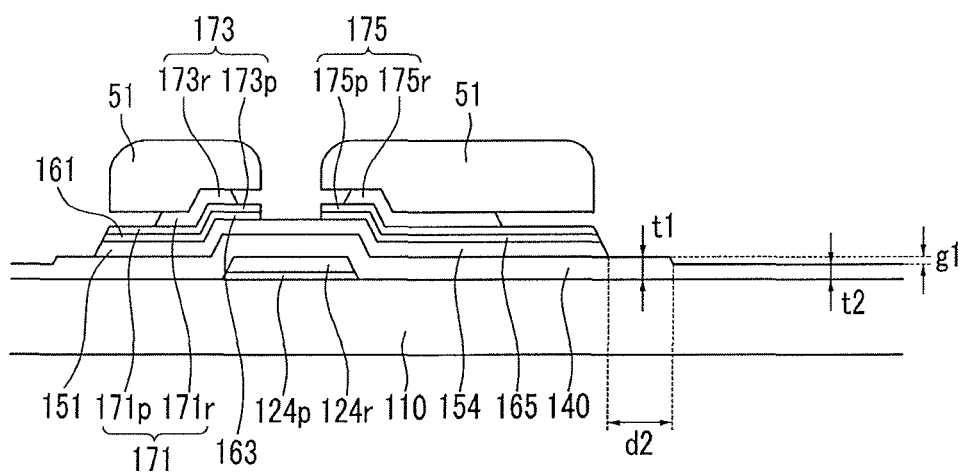

Thereafter, as shown in FIG. 9 and FIG. 10, the first metal layer 170p, the second amorphous silicon layer 160, the first amorphous silicon layer 150 and gate insulating layer 140 are dry etched by using the second photosensitive layer pattern 51 as the mask. FIG. 9 illustrates the state in which the first metal layer 170p is etched and separated, and FIG. 10 illustrates the state in which the second amorphous silicon layer 160 is etched and separated and the channel of the thin film transistor is exposed.

FIG. 9 illustrates that the first metal layer 170p is separate and the gate lines 171p and 171r, source electrodes 173p and 173r and drain electrodes 175p and 175r of the double layer are formed. The double lower layers 171p, 173p, and 175p have a region in which upper sides are exposed to the outside. The width of the exposed region may be about 15 to about 70% of the width of all the lower layers 171p, 173p, and 175p. In FIG. 9, the width d1 of the portion where a side of the lower layer 175p is exposed may have a value of about 0.3 to about 2.0 μm.

The second amorphous silicon layer 160, the first amorphous silicon layer 150 and the gate insulating layer 140 that are not covered with the second photosensitive layer pattern 51 are etched. In views of the region that is represented by P in FIG. 9, the first amorphous silicon layer 150, the region that is not covered with the second photosensitive layer pattern 51, is etched and has a step shape. In addition, the gate insulating layer 140 has a thickness that is different from that of the gate insulating layer 140 where the region that is not covered with the first amorphous silicon layer 150 is etched, such that it creates a step. Thereafter, when the etching is further performed, as shown in FIG. 10, the second amorphous silicon layer 160 is separated to form the ohmic contact layers 161 and 165, and the channel part 154 of the semiconductor that forms the channel of the thin film transistor is exposed.

In FIG. 10, by controlling the process condition, the step-shaped structure that is disposed on the first amorphous silicon layer 150 is completely etched. As a result, the channel part 154 of the semiconductor may have a height that is different from that of the portion that is covered with the source electrode 173 and drain electrode 175. In addition, the step that is disposed on the gate insulating layer 140 has a structure including additional steps. In FIG. 10, the height of the thickness difference g1 may have a range of about 500 to about 3000 Å, or may have a range of about ⅛ to about ¾ of the entire thickness of the gate insulating layer 140. In addition, in FIG. 10, the width of d2 may be about 0.3 to about 1.5 μm. In addition, in the width of the gate insulating layer 140 that is not etched, the d2 width may be about 3 to about 30% of the gate insulating layer 140.

If photosensitive layer patterns having different thicknesses are used, then the ohmic contact layers 161, 163, and 165 have the same plane pattern as the lower layers 171p, 173p, and 175p of the data line 171, source electrode 173 and drain electrode 175. Further, the semiconductor 151 has substantially the same plane pattern as the lower layers 171p, 173p, and 175p of the data line 171, source electrode 173 and drain electrode 175 except for the exposed portion between the drain electrode 175 and the source electrode 173.

Figure 11:
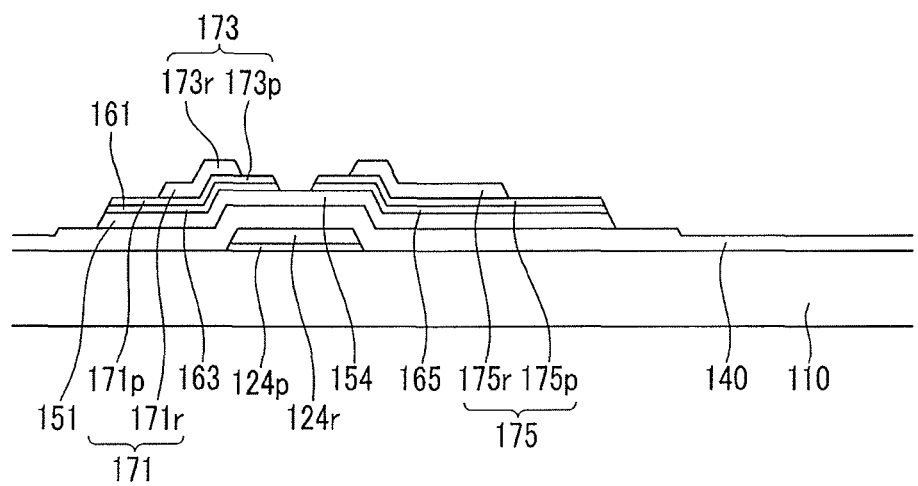

Thereafter, as shown in FIG. 11, the photosensitive layer pattern is removed by ashing. FIG. 4 to FIG. 11 illustrate steps for forming the semiconductor layer 151, ohmic contact layers 161, 163, and 165 and data line 171, source electrode 173 and drain electrode 175 by forming the photosensitive layer pattern using one mask. Since the pattern is formed by using one mask, it has substantially the same plane pattern as the region other than the channel part 154 and with exception of the upper layers 171r, 173r, and 175r. The upper layers 171r, 173r, and 175r may be wet etched in FIG. 8 and may have a plane pattern that is reduced by, for example, the width d1.

Figure 12:
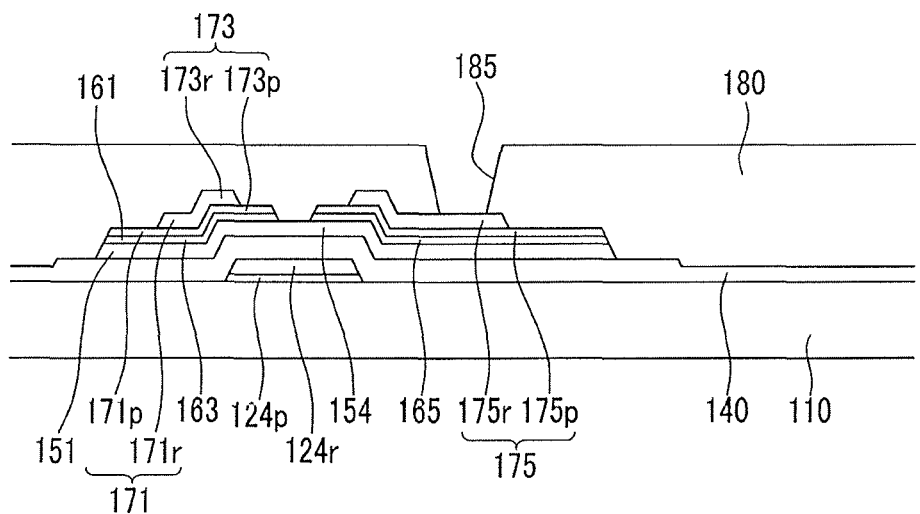
Figure 13:
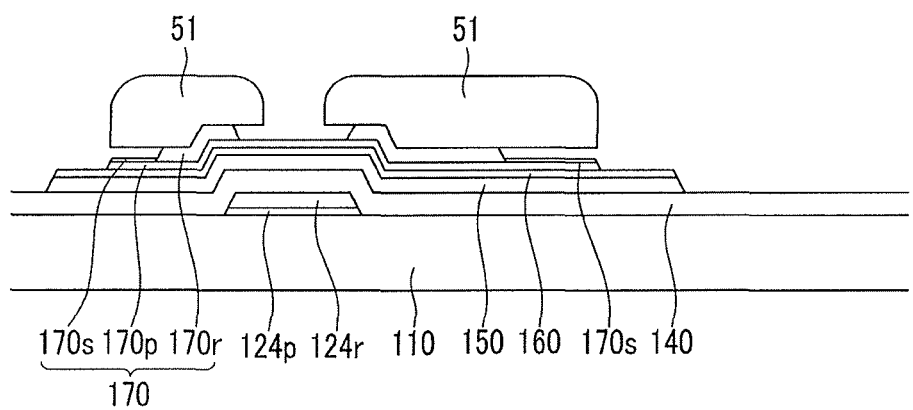
FIG. 13 is a cross-sectional view that illustrates the case of when an oxide layer is formed in FIG. 8.

Thereafter, as shown in FIG. 12, the passivation layer 180 is formed by using the organic material or inorganic material, and a contact hole 185 for exposing the upper layer 175r of the drain electrode 175 is formed by using the photosensitive layer. Thereafter, as shown in FIG. 2, a pixel electrode 191 that is electrically contacted with the exposed drain electrode 175 is formed by layering the transparent conductor such as ITO or IZO and etching it. Like FIG. 8, in the example of when only the second metal layer 170r is etched, the titanium oxide layer 170s may be layered on the upper part of the exposed the first metal layer 170p, which is illustrated in FIG. 13. Like FIG. 13, if the exposed titanium oxide layer 170s is layered, the titanium oxide layer 170s may be etched. For example, as shown in FIG. 9 and FIG. 10, in the step for etching the first metal layer 170p, the second amorphous silicon layer 160 and the first amorphous silicon layer 150, the titanium oxide layer 170s that is formed on the exposed upper part of the first metal layer 170p is removed.

In at least one embodiment, methods of three or four steps are carried out to perform the processes of FIG. 9 and FIG. 10 in conjunction with the removal of the titanium oxide layer 170s. The method of three steps is performed through a first step of removing the titanium oxide layer 170s, a second step of etching the first metal layer 170p, the second amorphous silicon layer 160 and the first amorphous silicon layer 150 and a third step of performing post treatment.

The titanium oxide layer 170s may be removed by using a gas that includes F such as $SF_6$ or $CF_4$ (referred to as a first manner) or removed by using various gases including $SF_6$ (e.g., $SF_6$ only, $SF_6$/He, $SF_6$/$N_2$, $SF_6$/$O_2$, or $SF_6$/$O_2$/He) (referred to as a second manner). In the second manner, the weight ratio of $SF_6$ and helium (He) may be 1:0 to 1:5, and the pressure range used in etching may be 60 to 400 mT. The post treatment includes a kind of washing treatment for removing etching byproducts that are disposed on the upper part of each layer after the etching.

The method of four steps is performed through a first step of removing the titanium oxide layer 170s, a second step of removing the first metal layer 170p, a third step of etching the second amorphous silicon layer 160 and the first amorphous silicon layer 150, and a fourth step of performing post treatment. The step of removing the titanium oxide layer 170s may use the same gas that is used when the titanium oxide layer 170s is removed in the three step method. In the second step of removing the first metal layer 170p, a gas that includes Cl (e.g., $Cl_2$/He, $Cl_2$/Ar, or $Cl_2$) may be used, where the weight ratio of $Cl_2$ and helium (He) may be 1:0 to 1:5, and the pressure range used in etching may be 60 to 200 mT.

FIG. 14 is a picture that illustrates a cross-section of the wiring formed in a thin film transistor array panel according to an exemplary embodiment of the invention. FIG. 14 illustrates cross-sections of the upper layer 171r that is formed of pure copper (Cu), the lower layer 171p that is formed of pure titanium (Ti), the semiconductor 151 that is formed of the amorphous silicon (a-Si), and the gate insulating layer 140 that is formed of silicon nitride (SiNx).

Referring to FIG. 14, the semiconductor layer 151 protrudes from the upper layer 171r by about 1.06 μm, and the lower layer 171p that is formed of titanium (Ti) protrudes based on the protrusion width of the semiconductor layer 151. In addition, the gate insulating layer 140 has a step shape like the P' region of FIG. 14, and the width from an end of the step shape to an end of the upper layer 171r is about 1.83 μm. Further, the step portions of the upper layer 171r, lower layer 171p, semiconductor layer 151, and gate insulating layer 140 are tapered, and the upper layer 171r is thicker than the lower layer 171p.

Figure 15:
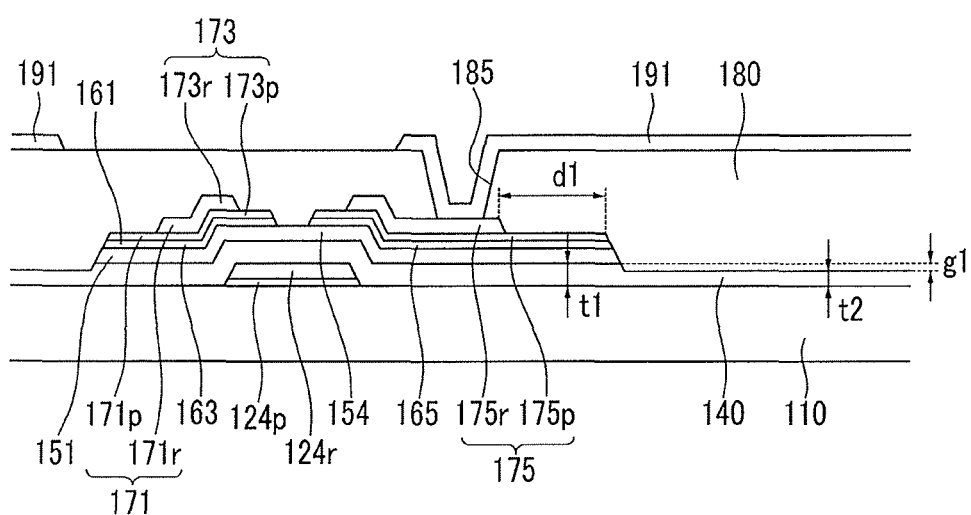
FIG. 15 is a cross-sectional view that illustrates the thin film transistor array panel according to an exemplary embodiment of the present invention, and the cross-sectional view that is taken along the line II-II of FIG. 1, FIG. 16 to FIG. 25 are cross-sectional views that illustrate a manufacturing method of the thin film transistor array panel according to an exemplary embodiment of the present invention, and the cross-sectional views that are taken along the line II-II of FIG. 1.

Hereinafter, a thin film transistor array panel according to an exemplary embodiment of the present invention will be described with reference to FIG. 1, and FIG. 15 to FIG. 26. FIG. 15 is a cross-sectional view that illustrates the thin film transistor array panel according to an exemplary embodiment of the present invention, and the cross-sectional view that is taken along the line II-II of FIG. 1.

The exemplary embodiment of FIG. 15 is different from the exemplary embodiment of FIG. 2 in that a thick portion having the first thickness t1 of the gate insulating layer 140 is not exposed to the outside of the semiconductor 151.

Referring to FIG. 1 and FIG. 15, a plurality of gate lines 121 are formed on an insulation substrate 110 (e.g., formed of a transparent glass or plastic). The gate line 121 transmits a gate signal and extends or mainly extends in a horizontal direction. Each gate line 121 includes a plurality of gate electrodes 124 that protrude from the gate line 121. The gate line 121 and gate electrode 124 have a dual-layer structure, where the gate line 121 includes a lower layer 121p and an upper layer 121r and the gate electrode 124 includes a lower layer 124p and an upper layer 124r.

The lower layers 121p and 121p include titanium (Ti) or titanium alloy, and the upper layers 121r and 124r include copper (Cu) or copper alloy. The lower layers 121p and 124p of the gate line 121 may have a thickness of about 10 to about 500 Å, and the upper layers 121r and 124r may have a thickness of about 1000 to about 7000 Å. The lower layer 121p and upper layer 121r of the gate line 121 may each have a tapered side, and be inclined at an angle of more than about 0° and about 70° or less with respect to a substrate 110.

The gate line 121 and gate electrode 124 may be formed to be a single layer or multiple layers such as triple layers or more, and may be formed of a material that includes other metals including copper and titanium (for example, molybdenum, aluminum, chromium, gold, silver, tantalum (Ta) and the like). The gate insulating layer 140 is formed on the gate line 121. The gate insulating layer may be made of an insulating material such as silicon nitride.

The gate insulating layer 140 has a first thickness t1 in a region that is covered with the semiconductor 151, and a second thickness t2 in a second region, where the first thickness t1 is larger than the second thickness t2. According to exemplary embodiment, the first region is thicker than the second region since the first region is not etched. The first thickness t1 may be in a range of about 3500 to about 5000 Å, the second thickness t2 may be in a range of about 500 to about 4500 Å, and the second thickness t2 may in a range that is about ¼ to about ⅞ of the first thickness t1. A thickness difference g1 that is a difference between the first thickness t1 and the second thickness t2 may in a range of about 500 to about 3000 Å, and a range that is about ⅛ to about ¾ of the first thickness t1.

A semiconductor 151 is formed on the gate insulating layer 140. The semiconductor 151 may be made of hydrogenated amorphous silicon, polysilicon or the like. The semiconductor 151 extends in or mainly extends in a vertical direction, and includes a plurality of channel parts 154 (projections) that extend toward the gate electrode 124. A plurality of ohmic contact stripes 161 and ohmic contact islands 165 are formed on the semiconductor 151.

The ohmic contact stripe 161 has a plurality of protruding parts 163 that extend toward the channel part 154 of the semiconductor 151, and the protruding part 163 and the ohmic contact island 165 form a pair and are disposed on the channel part 154 of the semiconductor stripe 151. On the ohmic contact layers 161 and 165 and gate insulating layer 140, a plurality of data lines 171 and a plurality of drain electrodes 175 are formed.

The data line 171 transports a data signal and extends or mainly extends in a vertical direction and crosses the gate line 121. Each data line 171 extends toward the gate electrode 124 and includes a plurality of source electrodes 173. The drain electrode 175 is separated from the data line 171, and extends toward a part of the source electrode 173. For example, when the source electrode 173 is U-shaped, the drain electrode 175 may extend towards an upper part in the middle of the U-shaped source electrode 173. The data line 171 and drain electrode 175 that include the source electrode 173 have the dual-layer structure of the upper layers 171r, 173r, and 175r and lower layers 171p, 173p, and 175p.

The upper layers 171r, 173r, and 175r include copper (Cu) or copper alloy, and the lower layers 171p, 173p, and 175p include copper (Cu) or copper alloy. Since the width of the upper layers 171r, 173r, and 175r is narrower than the width of the lower layers 171p, 173p, and 175p, the upper parts of the lower layers 171p, 173p, and 175p are exposed. About 15 to about 70% region of the lower layers 171p, 173p, and 175p are not covered with the upper layers 171r, 173r, and 175r, and are instead exposed. In FIG. 15, the width d1 of the lower layer having the exposed side has a width range of about 0.3 to about 2.0 μm.

The lower layers 171p, 173p, and 175p of the data line 171 and drain electrode 175 may have a thickness of about 10 to about 500 Å, and the upper layers 171r, 173r, and 175r may have a thickness of about 1000 to about 7000 Å. The lower layers 171p, 173p, and 175p and upper layers 171r, 173r, and 175r of the data line 171 and drain electrode 175 may each have a tapered side, and be inclined at an angle of 30° to 80° with respect to a substrate 110.

To prevent breakage while the data line 171 crosses the data line 171, the tapered angle of the data line 171 may be larger than the tapered angle of the gate line. The ohmic contact layers 161, 163, and 165 may be present only between the semiconductor 151 and the lower layers 171p, 173p, and 175p with the data line 171 and drain electrode 175 thereon, thereby lowering contact resistance therebetween. In addition, the ohmic contact layers 161, 163, and 165 may have the substantially same plane pattern as the lower layers 171p, 173p, and 175p of the data line 171 and drain electrode 175. For example, the ohmic contact layers 161, 163, and 165 and the lower layers 171p, 173p, and 175p may be simultaneously etched by using the same mask.

In the channel part 154 of the semiconductor 151, there is a portion between the source electrode 173 and drain electrode 175 and the data line 171 and drain electrode 175. The semiconductor 151 has substantially the same plane pattern as the ohmic contact layers 161 and 165 except for the exposed portion of the channel part 154. For example, the semiconductor 151 and ohmic contact layers 161, 163, and 165 may be simultaneously etched by using the same mask.

In at least one embodiment of the present invention, the semiconductor 151, ohmic contact layers 161, 163, and 165, data line 171, source electrode 173, and drain electrode 175 are etched by using one mask. As a result, the semiconductor 151, ohmic contact layers 161, 163, and 165, and the lower layers 171p, 173p, and 175p of the data line 171, source electrode 173 and drain electrode 175 have substantially the same plane pattern as the ohmic contact layers 161 and 165 except for the exposed portion of the channel part 154. One gate electrode 124, one source electrode 173 and one drain electrode 175 form one thin film transistor (TFT) in conjunction with the channel part 154 of the semiconductor 151, and the channel of the thin film transistor is formed at the channel part 154 between the source electrode 173 and drain electrode 175. On the data line 171, drain electrode 175 and channel part 154 portion, the passivation layer 180 is formed.

The passivation layer 180 may be made of inorganic insulators such as silicon nitride or silicon oxide, an organic insulator, a low dielectric insulator, etc. On the passivation layer 180, a plurality of contact holes 185 that expose an end of the drain electrode 175 is formed. On the passivation layer 180, a plurality of pixel electrodes 191 is formed.

The pixel electrode 191 is physically and electrically connected to the drain electrode 175 through the contact hole 185, and applied with a data voltage from the drain electrode 175. The pixel electrode 191 to which the data voltage is applied forms an electric field in conjunction with a common electrode (not shown) that is applied with a common voltage. The common electrode may be formed in a facing display panel or a thin film transistor array panel, such that the direction of the liquid crystal molecule of a liquid crystal layer (not shown) between the pixel electrode and the common electrode is determined. The pixel electrode 191 and common electrode forms a capacitor (hereinafter, referred to as a liquid crystal capacitor) to maintain the applied voltage after the thin film transistor is turned off. The pixel electrode 191 may form a storage capacitor by overlapping with a storage electrode line (not shown). The voltage maintaining ability of the liquid crystal capacitor may be increased due to the storage capacitor. The pixel electrode 191 may be made of a transparent conductor such as ITO or IZO.

The thin film transistor array panel that is shown in FIG. 1 and FIG. 15 will be described in detail in respects to a method for manufacturing the same according to an exemplary embodiment of the present invention with reference to FIG. 15 and FIG. 16 to FIG. 25. The manufacturing method of the thin film transistor array panel according to FIGS. 16 to 25 etches the first amorphous silicon layer 150 and the second amorphous silicon layer 160 after an etch back process is performed. As a result, the portion having the larger thickness in the gate insulating layer 140 is present only beneath the semiconductor 151.

Figure 16:
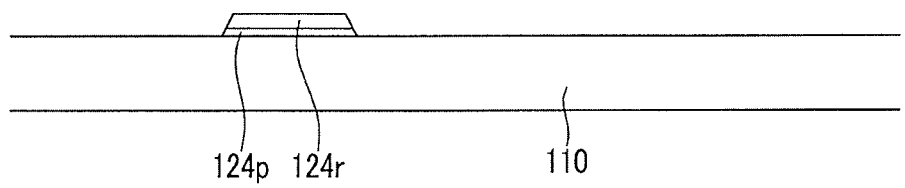

FIG. 16 to FIG. 25 are cross-sectional views that illustrate a manufacturing method of the thin film transistor array panel according to an exemplary embodiment of the present invention, and the cross-sectional views that are taken along the line II-II of FIG. 1. As shown in FIG. 16, titanium (Ti) or titanium (Ti) alloy is layered on the insulation substrate 110 (e.g., made of the transparent glass or plastic), copper (Cu) or copper (Cu) alloy is layered thereon to form a double layer, and the patterning is performed to form the gate line 121 that has the gate electrode 124. The lower layers 121$p$ and 124$p$ that are formed of titanium (Ti) or titanium (Ti) alloy may be layered in a thickness of about 10 to about 500 Å, and the upper layers 121$r$ and 124$r$ that are formed of copper (Cu) or copper (Cu) alloy may be layered in a thickness of about 1000 to about 7000 Å.

Thereafter, a photosensitive film (not shown) is layered and patterned, and the lower layers 121$p$ and 124$p$ and upper layers 121$r$ and 124$r$ are etched with an etchant by using the patterned photosensitive film as the mask. The used etchant may be an etchant that is capable of simultaneously etching the lower layers 121$p$ and 124$p$ and upper layers 121$r$ and 124$r$. For example, a nonperoxide-based (i.e., excluding $H_2O_2$) etchant including a fluorine (F) component may be used. Examples of the etchant include the first etchant or the second etchant that are described above.

The tapered side having the angle of more than about 0° and about 70° or less may be formed by simultaneously etching the lower layers 121$p$ and 124$p$ and upper layers 121$r$ and 124$r$ using the nonperoxide-based etchant such as the first and the second etchants. The upper layers 121$r$ and 124$r$ and lower layers 121$p$ and 124$p$ may be simultaneously etched by using the same etchant, but the tapered angle may be different, depending on the etching rate to the etchant.

While, an example of when the gate line 121 and gate electrode 124 is formed in a double layer of titanium and copper is provided, embodiments of the invention are not limited thereto. For example, the gate line 121 and gate electrode 124 may be formed of metal except titanium and copper, and they may be formed of a single layer or multiple layers of triple layers or more.

Figure 17:
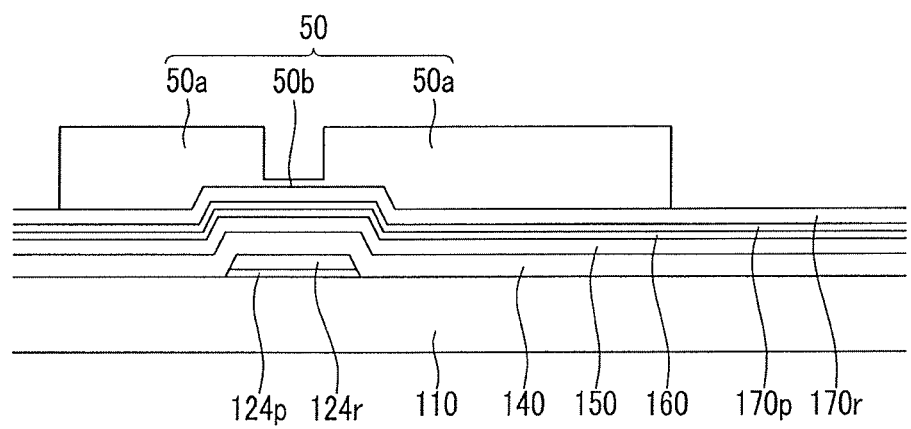

Next, as shown in FIG. 17, on the gate line 121 and gate electrode 124, the gate insulating layer 140, the first amorphous silicon layer 150, the second amorphous silicon layer 160, the first metal layer 170$p$ and the second metal layer 170$r$ are layered. The first amorphous silicon layer 150 does not include an impurity, the second amorphous silicon layer 160 is doped with a conductive impurity, the first metal layer 170$p$ is formed of a titanium or titanium alloy, and the second metal layer 170$r$ is formed of a copper or copper alloy. The gate insulating layer 140 may be formed in a thickness of about 3500 or more to about 5000 Å or less, the first metal layer 170$p$ may be layered in a thickness of about 10 to about 500 Å, and the second metal layer 170$r$ may be layered in a thickness of about 1000 to about 7000 Å.

The photosensitive film (referred to as a photo resist) is formed thereon, and then patterned to form the photosensitive film pattern 50. The photosensitive film pattern 50 has first portions 50$a$ and a second portion 50$b$, where the first portions 50 are thicker (e.g., substantially) than the second portion 50$b$. A difference in thickness of the photosensitive film pattern 50 may be obtained by controlling the intensity of light irradiated using the mask or by using a reflow method. When the intensity of light is controlled, a slit pattern or lattice pattern or a semi-transparent layer may be formed on the mask. The second portion 50$b$ having the smaller thickness is formed to correspond to a position at which the channel region of the thin film transistor will be formed.

Figure 18:
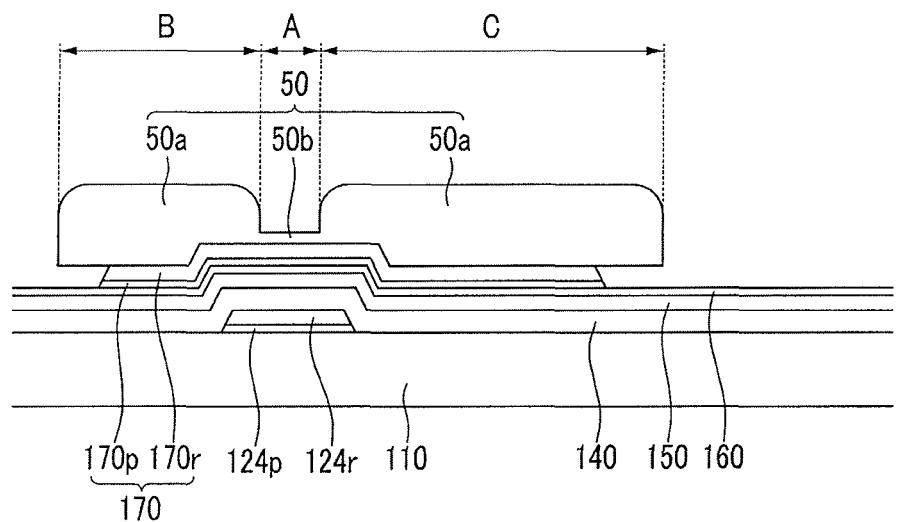

Thereafter, as shown in FIG. 18, the first metal layer 170$p$ and the second metal layer 170$r$ are etched by using the etchant that is capable of simultaneously etching the first metal layer 170$p$ and the second metal layer 170$r$ by using the photosensitive film pattern 50 as the mask. The etchant that is used may be the first etchant and the second etchant that etches the double layer wiring that may be formed of pure titanium and pure copper (refer to the description of etching the lower layers 121$p$ and 124$p$ and upper layers 121$r$ and 124$r$ of the gate line 121).

As described above, the first etchant or the second etchant includes a fluorine (F) component as a nonperoxide-based etchant. In addition, the first etchant and the second etchant may be used to etch the wiring of the double layer that is formed of pure titanium and pure copper, and in the case of the alloy, they may not be etched according to the added material. According at least one exemplary embodiment of the invention, the etchant that is used to etch the gate line 121 may be the same as the etchant that is used to etch the first metal layer 170$p$ and the second metal layer 170$r$.

As shown in FIG. 18, if the first metal layer 170$p$ and the second metal layer 170$r$ are etched by using the etchant, the first metal layer 170$p$ and the second metal layer 170$r$ and a portion of the lower part of the photosensitive film pattern 50 that are not covered with the photosensitive film pattern 50 may be etched by an isotropic etching characteristic of the etchant. The etchant that etches the first metal layer 170$p$ and the second metal layer 170$r$ does not etch the gate insulating layer 140, the first amorphous silicon layer 150 and the second amorphous silicon layer 160.

Figure 19:
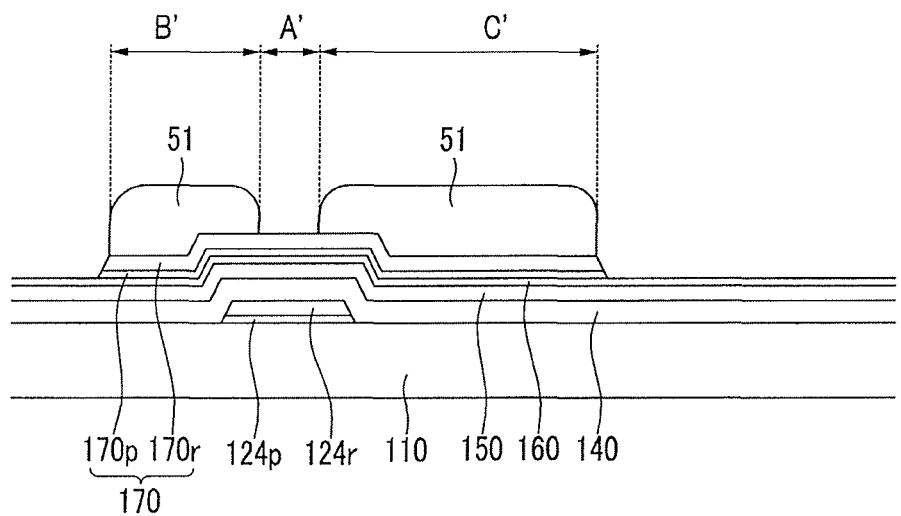

Thereafter, as shown in FIG. 19, the second portion 50b having the smaller thickness may be removed by etch back. The first portions 50a may be simultaneously etched to lower their width and height such that the second photosensitive film pattern 51 of FIG. 19 is formed. The second photosensitive film pattern 51 is formed in regions B' and C' that are narrower than the regions B and C) in which the photosensitive film pattern 50 is formed in FIG. 16. The second photosensitive film pattern 51 covers the first metal layer 170r region except for the A' region.

Figure 20:
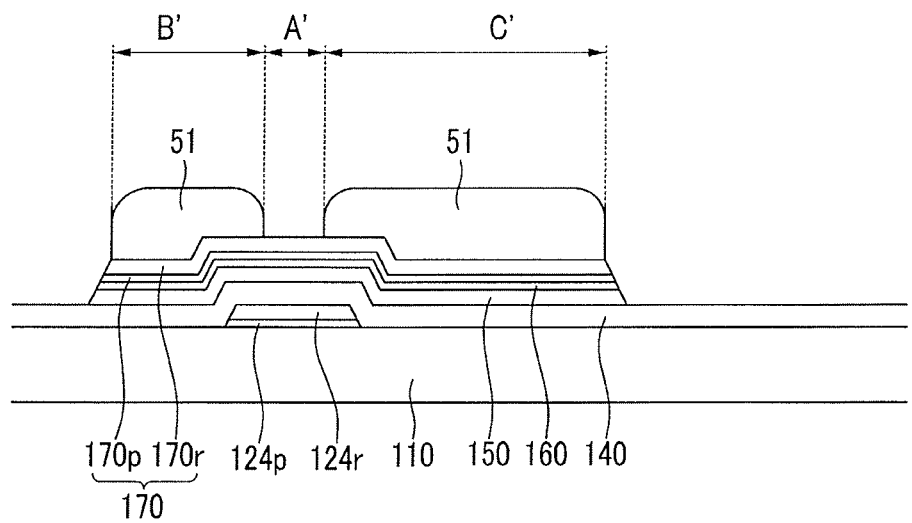

Thereafter, as shown in FIG. 20, the first amorphous silicon layer 150 and the second amorphous silicon layer 160 are etched by using the photosensitive film pattern 51 as the mask. The A' region is not covered with the second photosensitive film pattern 51, but covered with the second metal layer 170r, such that it is not etched.

Figure 21:
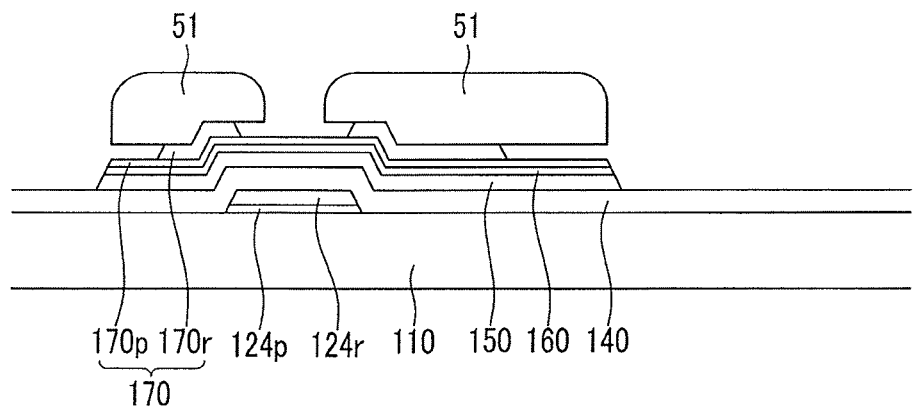

Thereafter, as shown in FIG. 21, only the second metal layer 170r is etched by using the photosensitive film pattern 51 as the mask and the etchant. The etchant that is used herein should be different from the etchant that is used in FIG. 16 and FIG. 18. For example, in FIG. 16 and FIG. 18, the etchant can etch both copper and titanium, but in FIG. 21, the etchant that can etch only copper is used. The etchant that is used in FIG. 21 is the nonperoxide-based etchant, but it does not include the fluorine (F) component. Examples of the etchant used include the etchants that are used in FIG. 8. Through the process of FIG. 21, the upper side of the first metal layer 170p is exposed. The width of the exposed portion of the first metal layer 170p may vary according to the exemplary embodiments.

Figure 22:
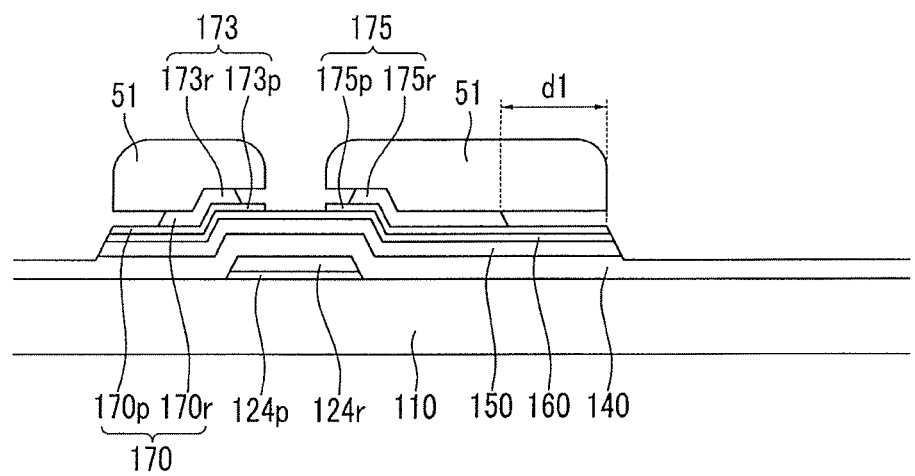
Figure 23:
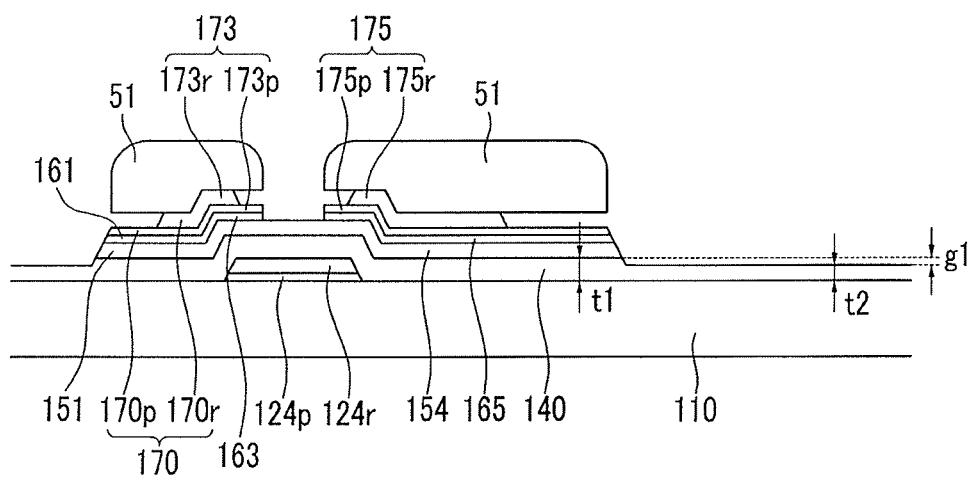

Thereafter, as shown in FIG. 22 and FIG. 23, the first metal layer 170p, the second amorphous silicon layer 160, the first amorphous silicon layer 150 and the gate insulating layer 140 are dry etched by using the second photosensitive film pattern 51 as the mask. FIG. 22 illustrates a state in which the first metal layer 170p is etched and separated, and FIG. 23 illustrates a state in which the second amorphous silicon layer 160 is etched and separated and the channel of the thin film transistor is exposed. FIG. 22 illustrates that the first metal layer 170p is separated and the gate lines 171p and 171r, source electrodes 173p and 173r and drain electrodes 175p and 175r of the double layer are formed.

The double lower layers 171p, 173p, and 175p have a region in which upper sides are exposed to the outside. The width of the exposed region is about 15 or more to about 70% or less of the width of the entire lower layers 171p, 173p, and 175p. In FIG. 22, the width d1 of the lower layer 175p having the exposed side has a value of about 0.3 to about 2.0 μm. The second amorphous silicon layer 160, the first amorphous silicon layer 150 and gate insulating layer 140 that are not covered with the second photosensitive film pattern 51 are etched, and since the second amorphous silicon layer 160 and the first amorphous silicon layer 150 are not exposed to the outside of the second photosensitive film pattern 51, they are not etched. In the gate insulating layer 140, only the exposed portion of the second photosensitive film pattern 51 is etched. As a result, the covered gate insulating layer 140 has a thickness that is different from that of the gate insulating layer 140 in which the region that is not covered with the first amorphous silicon layer 150 is etched.

Thereafter, the etching is further performed, as shown in FIG. 23, where the second amorphous silicon layer 160 is separated to form resistant contact members 161 and 165, and the channel part 154 of the semiconductor that forms the channel of the thin film transistor is exposed. The channel part 154 of the semiconductor may have the height that is different from that of the portion that is covered with the source electrode 173 and drain electrode 175. In addition, the thickness difference in the gate insulating layer 140 is increased. In FIG. 23, the height of the thickness difference g1 may have a value of about 500 or more to about 3000 Å or less, or may have a value of about ⅛ or more to about ¾ or less of the entire thickness of the gate insulating layer 140.

If photosensitive film patterns having different thickness are used, ohmic contact layers 161, 163, and 165 that have the same plane pattern as the lower layers 171p, 173p, and 175p of the data line 171, source electrode 173 and drain electrode 175 are formed. The semiconductor 151 has substantially the same plane pattern as the lower layers 171p, 173p, and 175p of the data line 171, source electrode 173 and drain electrode 175 except for the exposed portion between the drain electrode 175 and the source electrode 173.

Figure 24:
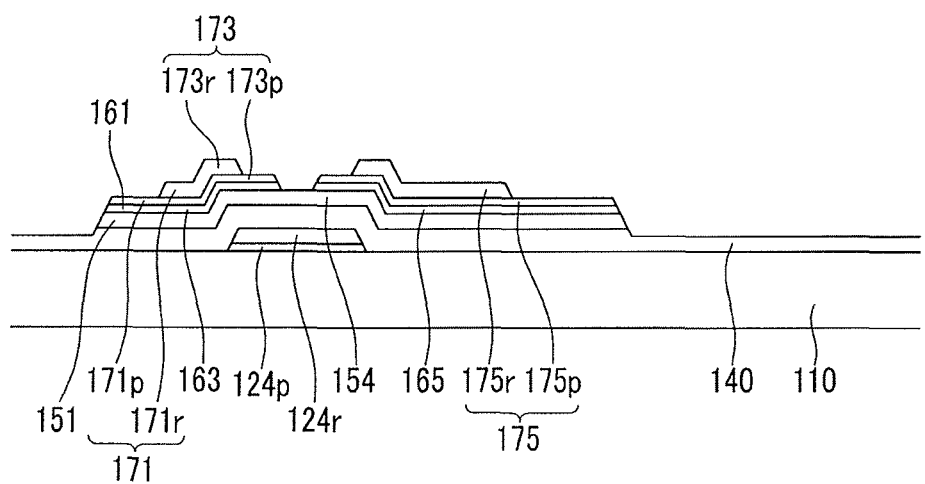

Thereafter, as shown in FIG. 24, the photosensitive film pattern is removed by ashing. FIG. 17 to FIG. 24 illustrate in detail steps for forming the semiconductor layer 151, ohmic contact layers 161, 163, and 165 and data line 171, source electrode 173 and drain electrode 175 by forming the photosensitive film pattern using one mask. Since the pattern is formed by using one mask, it has substantially the same plane pattern as the region other than the channel part 154 except for the upper layers 171r, 173r, and 175r. The upper layers 171r, 173r, and 175r may be wet etched in FIG. 21 to a plane pattern that is reduced by, for example, the width d1.

Figure 25:
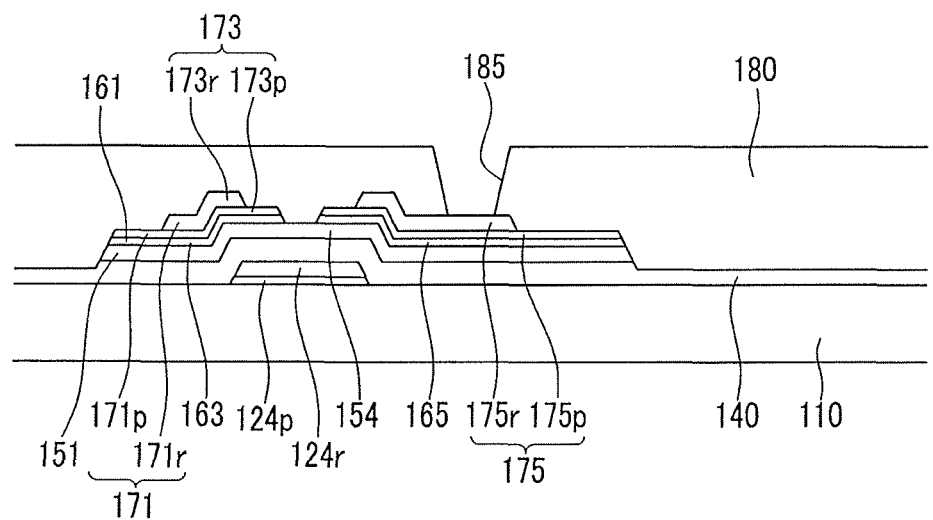

Thereafter, as shown in FIG. 25, the passivation layer 180 is formed by using an organic material or inorganic material, and a contact hole 185 for exposing the upper layer 175r of the drain electrode 175 is formed by using the photosensitive film. Thereafter, as shown in FIG. 15, a pixel electrode 191 that is electrically contacted with the exposed drain electrode 175 is formed by layering the transparent conductor such as ITO or IZO and etching it. Like FIG. 21, in the example of when only the second metal layer 170r is etched, the titanium oxide layer 170s may be layered on the upper part of the exposed the first metal layer 170p, which is illustrated in FIG. 26.

Figure 26:
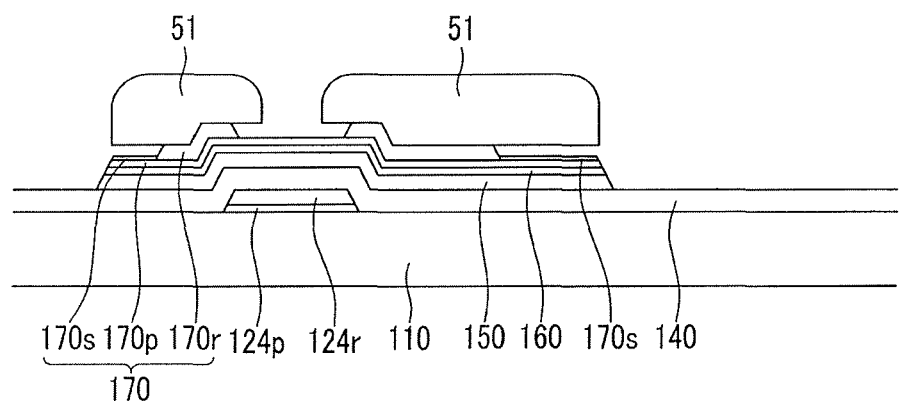
FIG. 26 is a cross-sectional view that illustrates the case of when an oxide layer is formed in FIG. 21.

Like FIG. 26, if the exposed titanium oxide layer 170s is layered, the titanium oxide layer 170s should be etched. For example, as shown in FIG. 22 and FIG. 23, in the step of etching the first metal layer 170p, the second amorphous silicon layer 160 and the first amorphous silicon layer 150, the titanium oxide layer 170s that is formed on the exposed upper part of the first metal layer 170p is removed.

According to an exemplary embodiment of the present invention, a method of three or four steps may be used to perform the processes of FIG. 22 and FIG. 23 in conjunction with the removal of the titanium oxide layer 170s. The method of three steps is performed through a first step of removing the titanium oxide layer 170s, a second step of etching the first metal layer 170p, the second amorphous silicon layer 160 and the first amorphous silicon layer 150 and a third step of performing a post treatment. The titanium oxide layer 170s may be removed by using the gas that includes F such as $SF_6$ or $CF_4$ (referred to as a first manner) or removed by using various gases including $SF_6$ (e.g., $SF_6$ only, $SF_6$/He, $SF_6$/$N_2$, $SF_6$/$O_2$, $SF_6$/$O_2$/He) (referred to as a second manner). In the second manner, the weight ratio of $SF_6$ and helium (He) may be 1:0 to 1:5, and the pressure range used in etching may be 60 to 400 mT. The post treatment includes a kind of washing treatment for removing etching byproducts that are disposed on the upper part of each layer after the etching.

The method of four steps is performed through a first step of removing the titanium oxide layer 170s, a second step of removing the first metal layer 170p, a third step of etching the second amorphous silicon layer 160 and the first amorphous silicon layer 150, and a fourth step of performing post treatment. The step of removing the titanium oxide layer 170s may use the gas that is used when the titanium oxide layer 170s is removed in the three step method. In the second step of removing only the first metal layer 170p, a gas that includes Cl of $Cl_2$/He, $Cl_2$/Ar, and $Cl_2$ only may be used, the weight ratio of $Cl_2$ and helium (He) may be 1:0 to 1:5, and the pressure range used in etching may be 60 to 200 mT.

Figure 27:
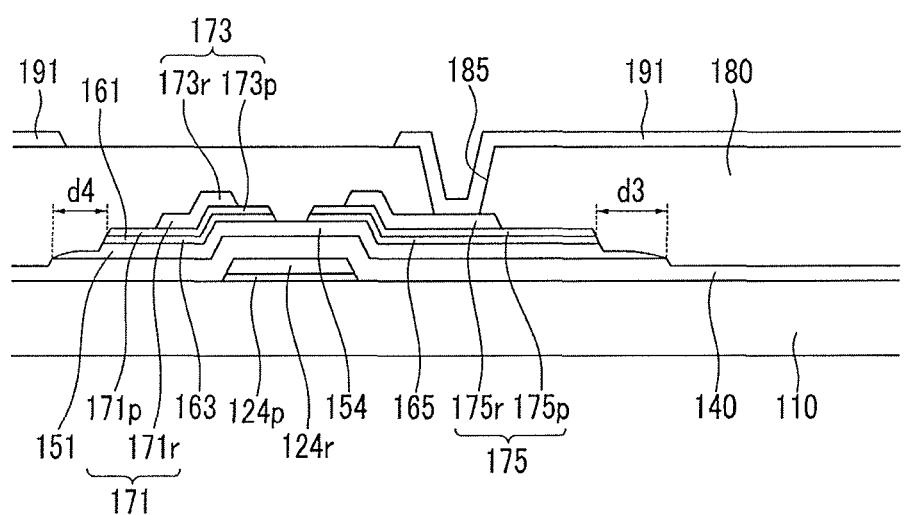
FIG. 27 is a cross-sectional view that illustrates the thin film transistor array panel according to an exemplary embodiment of the present invention, and the cross-sectional view that is taken along the line II-II of FIG. 1.

In FIG. 9 and FIG. 10, the step-shaped structure (refer to P of FIG. 9) disposed on the first amorphous silicon layer 150 is etched by controlling the process condition. When ab etch condition is specified, the first amorphous silicon layer 150 having the step shape is not exposed to the outside, and in another example of a different condition, the step shape structure remains on the corresponding portion. An exemplary embodiment where the step shape structure remains on the first amorphous silicon layer 150 is shown in FIG. 27. FIG. 27 is a cross-sectional view that illustrates the thin film transistor array panel according to another exemplary embodiment of the present invention, and the cross-sectional view that is taken along the line II-II of FIG. 1. The structure of FIG. 27 has a step shape that is exposed to the outside of the lower layers 171p, 173p, and 175p and ohmic contact layers 161, 163, and 165 even though the first amorphous silicon layer 150 constitutes the semiconductor layer 151 because the conditions are not satisfied in the thin film transistor substrate that is manufactured according to FIG. 3 to FIG. 9.

The exposed width may vary according to the position, and FIG. 27 illustrates the semiconductor 151 that is exposed by the widths of d3 and d4. Here, d3 and d4 are the widths from ends of the lower layers 171p, 173p, and 175p. In FIG. 27, an end of the exposed region of the semiconductor 151 corresponds to the boundary of the region having the larger thickness of the gate insulating layer 140. However, it may be formed by disposing it in the position that is at a predetermined distance from the boundary of the thick portion of the gate insulating layer 140 according to an exemplary embodiment. For example, in the exemplary embodiment like FIG. 27, the semiconductor layer 151, resistant contact members 161, 163, and 165 and data line 171, source electrode 173 and drain electrode 175 are formed by forming the photosensitive film pattern as the mask, but since the semiconductor layer 151 has the exposed region, the semiconductor 151 does not have the substantially same plane pattern as the resistant contact members 161, 163, and 165 and data line 171, source electrode 173 and drain electrode 175. This may depend on the size of the exposed step region and the exposed width of the semiconductor layer 151. For example, it cannot be said that in the example of when the step region of the exposed semiconductor layer 151 is disposed apart from the boundary of the thick portion of the gate insulating layer 140, that it has the substantially same plane pattern as the resistant contact members 161, 163, and 165 and data line 171, source electrode 173 and drain electrode 175. However, if the step region of the exposed semiconductor layer 151 is not disposed apart from the boundary of the thick portion of the gate insulating layer 140 or, as shown in FIG. 27, it corresponds to the boundary of the thick portion of the gate insulating layer 140, it can have substantially the same plane pattern.

In an embodiment of the present invention, when the lower layer that is made of the titanium (Ti) alloy is formed (e.g., a molybdenum-titanium (Mo—Ti) alloy), if the wet etching is performed by using the non-peroxide etchant, the etching rate is very high, and it may be difficult to etch it in conjunction with the upper layer including copper. Therefore, in this example, the lower layer and the upper layer may be separately etched.

According to an exemplary embodiment, a color filter or light blocking member (not shown) may be formed on the thin film transistor, for example, on the upper region of the lower region thereof on the basis of the thin film transistor.

Exemplary embodiments used to illustrate the present invention disclose the gate line having a double layer of titanium and copper. However, the data line layer that has the semiconductor layer and the double layer of titanium (or titanium alloy) and copper (or copper alloy) is etched, and the gate line may be formed of a single layer or multiple layers, and may be formed of other metals such as molybdenum, aluminum, chromium, gold, silver, and tantalum (Ta) in addition to copper and titanium.

While the formation of one layer of the wiring using titanium alloy or titanium has been described, one layer of the wiring may be formed by using only pure titanium instead of the titanium alloy. The wiring layer that is formed of pure titanium may have a density of about 4.5 g/cm$^{-3}$, a melting point of about 1940 K, an electronegativity of about 1.54, an electrical resistance is about 0.42 µOm at 20° C., a thermal conductivity of about 21.9 W at about 300 K, and a thermal expansion coefficient of about 8.6 µm at 25° C.

Having described exemplary embodiments of the invention, it is to be understood that the invention is not limited to the disclosed embodiments, but, on the contrary, is intended to cover various modifications and equivalent arrangements included within the spirit and scope of the disclosure.

What is claimed is:

1. A thin film transistor array panel comprising:
   a gate line;
   a gate insulating layer that covers the gate line;
   a semiconductor layer that is disposed on the gate insulating layer;
   a data line and drain electrode that are disposed on the semiconductor layer;
   a passivation layer that covers the data line and drain electrode and has a contact hole that exposes a portion of the drain electrode; and
   a pixel electrode that is electrically connected to the drain electrode through the contact hole,
   wherein the data line and drain electrode each have a double layer that includes a lower layer of titanium and an upper layer of copper, and the lower layer is wider than the upper layer, and the lower layer has a region that is exposed,
   wherein the gate insulating layer has a first portion that has a first thickness and a second portion that has a second thickness that is smaller than the first portion,
   wherein the pixel electrode overlaps upper surfaces of the first and second portions that are adjacent one another,
   wherein part of the upper surface of the first portion overlapping the pixel electrode contacts the passivation layer.

2. The thin film transistor array panel of claim 1, wherein a width of the exposed region of the lower layer is about 15% to about 70% of that of the entire lower layer.

3. The thin film transistor array panel of claim 1, wherein a difference between the first thickness and the second thickness is about ⅛ to about ¾ of the first thickness.

4. The thin film transistor array panel of claim 1, wherein the gate line has a double layer that includes a lower layer of titanium and the upper layer of copper.

5. The thin film transistor array panel of claim 1, wherein the contact hole exposes the upper layer of the drain electrode to contact the upper layer and the pixel electrode.

6. The thin film transistor array panel of claim 1, further comprising a resistant contact layer that is disposed between the semiconductor layer and the data line and drain electrode.

7. A thin film transistor array panel comprising:
a gate line;
a gate insulating layer that covers the gate line;
a semiconductor layer that is disposed on the gate insulating layer;
a data line and drain electrode that are disposed on the semiconductor layer;
a passivation layer that covers the data line and drain electrode and has a contact hole that exposes a portion of the drain electrode; and
a pixel electrode that is electrically connected to the drain electrode through the contact hole,
wherein the data line and drain electrode each have a double layer that includes a lower layer of titanium and an upper layer of copper, and the lower layer is wider than the upper layer, and the lower layer has a region that is exposed, and
wherein the gate insulating layer has a step shape and the pixel electrode overlaps the entire step shape,
wherein part of an upper surface of a thicker step of the step shape contacts the passivation layer.

8. The thin film transistor array panel of claim 7, wherein a width of the exposed region of the lower layer is about 15% to about 70% of that of the entire lower layer.

9. The thin film transistor array panel of claim 7, wherein the gate line has a double layer that includes a lower layer of titanium and the upper layer of copper.

10. The thin film transistor array panel of claim 7, wherein the contact hole exposes the upper layer of the drain electrode to contact the upper layer and the pixel electrode.

11. The thin film transistor array panel of claim 7, further comprising a resistant contact layer that is disposed between the semiconductor layer and the data line and drain electrode.

* * * * *